US012419162B2

(12) United States Patent
Woo et al.

(10) Patent No.: US 12,419,162 B2
(45) Date of Patent: Sep. 16, 2025

(54) DISPLAY DEVICE INCLUDING LIGHT BLOCKING LAYER

(71) Applicant: SAMSUNG DISPLAY CO., LTD., Yongin-si (KR)

(72) Inventors: Minwoo Woo, Seoul (KR); Sungho Kim, Suwon-si (KR); Seokje Seong, Seongman-si (KR); Jinsung An, Gwacheon-si (KR); Seunghyun Lee, Asan-si (KR); Wangwoo Lee, Osan-si (KR); Jiseon Lee, Hwaseong-si (KR); Yoon-Jong Cho, Seongnam-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 587 days.

(21) Appl. No.: 17/836,183

(22) Filed: Jun. 9, 2022

(65) Prior Publication Data

US 2023/0071577 A1 Mar. 9, 2023

(30) Foreign Application Priority Data

Sep. 6, 2021 (KR) .................. 10-2021-0118398

(51) Int. Cl.
| | |
|---|---|
| *H10K 59/126* | (2023.01) |
| *H10K 50/86* | (2023.01) |
| *H10K 59/122* | (2023.01) |
| *G09G 3/3233* | (2016.01) |

(52) U.S. Cl.
CPC ......... *H10K 59/126* (2023.02); *H10K 50/865* (2023.02); *G09G 3/3233* (2013.01); *G09G 2300/0426* (2013.01); *G09G 2300/0819* (2013.01); *G09G 2300/0842* (2013.01); *G09G 2300/0861* (2013.01); *G09G 2330/021* (2013.01); *H10K 59/122* (2023.02)

(58) Field of Classification Search
CPC .. G09G 3/3241; H10K 50/865; H10K 59/122; H10K 59/123; H10K 59/124; H10K 59/126
See application file for complete search history.

(56) References Cited

U.S. PATENT DOCUMENTS

| | | | |
|---|---|---|---|
| 2020/0286972 A1* | 9/2020 | Seo | ............ H10K 59/121 |
| 2021/0288294 A1 | 9/2021 | Guo et al. | |

FOREIGN PATENT DOCUMENTS

| | | |
|---|---|---|
| CN | 112786812 | 5/2021 |
| KR | 10-0666553 | 1/2007 |
| KR | 10-2019-0028245 | 3/2019 |

\* cited by examiner

*Primary Examiner* — Nelson Garces
(74) *Attorney, Agent, or Firm* — F. CHAU & ASSOCIATES, LLC

(57) ABSTRACT

A display device includes an electronic module and a display panel including a first display area that overlaps the electronic module and a second display area that does not overlap the electronic module. The display panel includes a base layer, a light emitting element layer disposed on the base layer, and a light blocking layer disposed between the base layer and the light emitting element layer. The light emitting element layer includes a plurality of first light emitting elements disposed in the first display area and a plurality of second light emitting elements disposed in the second display area. The light blocking layer includes a plurality of first light blocking patterns disposed in the first display area and respectively overlapping the first light emitting elements.

24 Claims, 20 Drawing Sheets

DISPLAY DEVICE INCLUDING LIGHT BLOCKING LAYER

CROSS-REFERENCE TO RELATED APPLICATION

This U.S. non-provisional patent application claims priority under 35 U.S.C. § 119 to Korean Patent Application No. 10-2021-0118398, filed on Sep. 6, 2021, the disclosure of which is hereby incorporated by reference in its entirety.

TECHNICAL FIELD

Embodiments of the present disclosure relate to a display device. More particularly, embodiments of the present disclosure relate to a display device having increased transmittance in a portion of a display area thereof.

DISCUSSION OF RELATED ART

Various types of display devices are being used to provide images. Such display devices may include an electronic module that receives an external signal or provides an output signal to the outside. For example, the electronic module may be a camera module, a sensor, an audio module, etc.

SUMMARY

Embodiments of the present disclosure provide a display device having increased transmittance in a display area overlapping an electronic module.

Embodiments of the present disclosure provide a display device including a light blocking pattern that overlaps a light emitting element and is arranged irregularly in the display area overlapping the electronic module, which may prevent a light flare of the electronic module.

Embodiments of the present disclosure provide a display device including an electronic module and a display panel including a first display area that overlaps the electronic module and a second display area that does not overlap the electronic module and including a base layer, a light emitting element layer disposed on the base layer, and a light blocking layer disposed between the base layer and the light emitting element layer. The light emitting element layer includes a plurality of first light emitting elements disposed in the first display area and a plurality of second light emitting elements disposed in the second display area, and the light blocking layer includes a plurality of first light blocking patterns disposed in the first display area and respectively overlapping the first light emitting elements.

In an embodiment, the light blocking layer further includes a plurality of second light blocking patterns disposed in the second display area and respectively overlapping the second light emitting elements, the first light blocking patterns are irregularly arranged when viewed in a plane, and the second light blocking patterns are regularly arranged when viewed in a plane.

In an embodiment, each of the first light blocking patterns is not aligned with the overlapped first light emitting element among the first light emitting elements when viewed in a plane, and each of the second light blocking patterns is aligned with the overlapped second light emitting element among the second light emitting elements when viewed in a plane.

In an embodiment, a center of one first light blocking pattern among the first light blocking patterns is shifted from a center of the overlapped first light emitting element by a first distance in a first direction, and a center of another first light blocking pattern adjacent to the one first light blocking pattern is shifted from a center of the overlapped first light emitting element by a second distance in a second direction.

In an embodiment, the first distance is different from the second distance when the first direction is the same as the second direction, and the first distance is the same as or different from the second distance when the first direction is different from the second direction.

In an embodiment, the one first light blocking pattern has an area different from an area of the another first light blocking pattern in a plane when the first direction is the same as the second direction and the first distance is the same as the second distance.

In an embodiment, the one first light blocking pattern has a shape different from a shape of the another first light blocking pattern in a plane when the first direction is the same as the second direction and the first distance is the same as the second distance.

In an embodiment, the display panel further includes a circuit layer disposed between the base layer and the light emitting element layer in the second display area and including a pixel circuit driving the second light emitting elements, the circuit layer includes a plurality of insulating layers including a first insulating layer and a second insulating layer disposed on the first insulating layer, and the pixel circuit includes a first gate disposed on the first insulating layer in the second display area and a second gate disposed on the second insulating layer in the second display area.

In an embodiment, the first light blocking patterns and the first gate are disposed on a same layer and include a same material.

In an embodiment, the first light blocking patterns and the second gate are disposed on a same layer and include a same material.

In an embodiment, the display panel includes a third display area defined therein and adjacent to the first display area, and the display panel further includes a third light emitting element disposed in the third display area, a first pixel circuit disposed in the third display area that drives the first light emitting element, and a third pixel circuit disposed in the third display area that drives the third light emitting element.

In an embodiment, the display panel further includes a second pixel circuit disposed in the second display area that drives the second light emitting element, and the first display area has a transmittance higher than a transmittance of the second display area and a transmittance of the third display area.

In an embodiment, each of the first light emitting elements includes a first lower electrode in which a light emitting area is defined, a first light emitting layer disposed on the first lower electrode, and a first upper electrode disposed on the first light emitting layer, each of the first light blocking patterns overlaps the first lower electrode, and each of the first light blocking patterns has an area greater than an area of the first lower electrode.

In an embodiment, the light emitting area is defined in each of the first lower electrodes of the first light emitting elements, and each of the light emitting areas is defined at a same position in each of the first lower electrodes in a plane.

In an embodiment, the light blocking layer is disposed on the base layer, the display panel further includes a circuit layer disposed between the light blocking layer and the light emitting element layer, and the second light blocking patterns are implemented as a rear surface metal layer, which may protect pixel circuits disposed in the circuit layer.

Embodiments of the present disclosure provide a display device including an electronic module and a display panel including a first display area that overlaps the electronic module and a second display area that does not overlap the electronic module and has a transmittance greater than a transmittance of the first display area. The display panel includes a base layer and a light emitting element layer disposed on the base layer and including a plurality of first light emitting elements disposed in the first display area and a plurality of second light emitting elements disposed in the second display area. Each of the first light emitting elements includes a first lower electrode, a first light emitting layer, and a first upper electrode, and each of the second light emitting elements includes a second lower electrode, a second light emitting layer, and a second upper electrode. The display panel further includes a plurality of first light blocking patterns disposed in the first display area and respectively overlapping the first lower electrode, and a plurality of second light blocking patterns disposed in the second display area and respectively overlapping the second lower electrode. Each of the first light blocking patterns is not aligned with the first lower electrode, and each of the second light blocking patterns is aligned with the second lower electrode.

In an embodiment, the display panel includes a circuit layer disposed between the base layer and the light emitting element layer, the circuit layer includes a plurality of insulating layers, the first light blocking patterns and the second light blocking patterns are disposed on a same layer, and the first light blocking patterns and the second light blocking patterns are disposed on the base layer or one of the insulating layers.

In an embodiment, the first lower electrode includes a light emitting area defined therein by a pixel definition pattern that covers a portion of the first lower electrode, and a position of the light emitting area defined in the first lower electrode is the same in each of the first light emitting elements.

In an embodiment, one first light blocking pattern among the first light blocking patterns is shifted from the overlapped first lower electrode in a first direction by a first distance in a plane, and another first light blocking pattern among the first light blocking patterns is shifted from the overlapped first lower electrode in a second direction by a second distance.

In an embodiment, the first direction is different from the second direction, and the first distance is the same as or different from the second distance.

In an embodiment, the first light blocking patterns and the second light blocking patterns include a same metal.

In an embodiment, the display panel includes a third display area defined therein and adjacent to the first display area, and the display panel further includes a third light emitting element disposed in the third display area, a first pixel circuit disposed in the third display area to drive the first light emitting element, and a third pixel circuit disposed in the third display area to drive the third light emitting element.

In an embodiment, the display panel further includes a circuit layer disposed between the base layer and the light emitting element layer in the third display area and including the first pixel circuit and the third pixel circuit, the circuit layer includes a plurality of insulating layers including a first insulating layer and a second insulating layer disposed on the first insulating layer, and each of the first pixel circuit and the third pixel circuit includes a first gate disposed on the first insulating layer and a second gate disposed on the second insulating layer.

In an embodiment, the first light blocking patterns are disposed on a same layer on which the first gate or the second gate is disposed, and the first light blocking pattern includes a same material as the first gate or the second gate.

According to embodiments of the present disclosure, as a transmittance in a portion of the display area of the display device increases, a quality of signals provided to or output from the electronic module is increased, and thus, a reliability of the display device is increased.

According to embodiments of the present disclosure, a flare phenomenon that causes a light scattering of the electronic module in the display device may be prevented by only changing the arrangement of the light blocking pattern without changing the arrangement of the electrode and the pixel definition layer in the light emitting element.

BRIEF DESCRIPTION OF THE DRAWINGS

The above and other features of the present disclosure will become more apparent by describing in detail embodiments thereof with reference to the accompanying drawings, in which.

DETAILED DESCRIPTION

Figure 1:
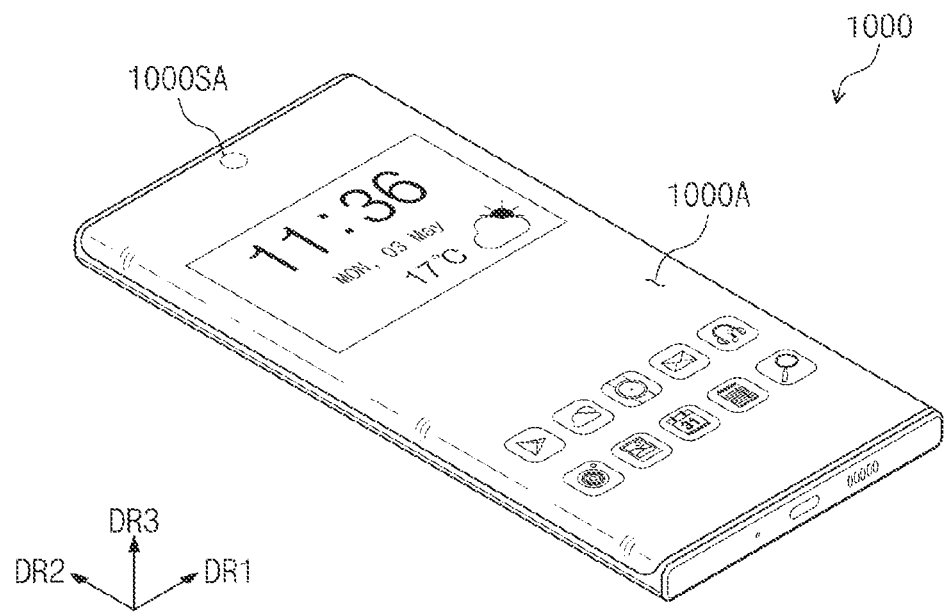
FIG. 1 is a perspective view showing a display device according to an embodiment of the present disclosure.

Embodiments of the present disclosure will be described more fully hereinafter with reference to the accompanying drawings. Like reference numerals may refer to like elements throughout the accompanying drawings.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

It will be understood that the terms "first," "second," "third," etc. are used herein to distinguish one element from another, and the elements are not limited by these terms. Thus, a "first" element in an embodiment may be described as a "second" element in another embodiment.

As used herein, the singular forms, "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

FIG. 1 is a perspective view showing a display device 1000 according to an embodiment of the present disclosure.

Referring to FIG. 1, the display device 1000 may be a device activated in response to electrical signals. As an example, the display device 1000 may be a mobile phone, a tablet computer, a monitor, a television, a car navigation unit, a game unit, or a wearable device. However, embodiments of the present disclosure are not limited thereto. FIG. 1 shows a mobile phone as a representative example of the display device 1000.

The display device 1000 may display an image through a display area 1000A. The display area 1000A may include a plane defined by a first direction DR1 and a second direction DR2. The display area 1000A may further include curved surfaces bent from at least two sides of the plane. However, the shape of the display area 1000A is not limited thereto. For example, according to an embodiment, the display area 1000A may include only the plane, or the display area 1000A may further include two or more curved surfaces, e.g., four curved surfaces respectively bent from four sides of the plane.

An area of the display area 1000A of the display device 1000 may be defined as a sensing area 1000SA. FIG. 1 shows one sensing area 1000SA as a representative example. However, the number of sensing areas 1000SA is not limited thereto. The sensing area 1000SA may be a portion of the display area 1000A. Accordingly, the display device 1000 may display the image through the sensing area 1000SA.

The display device 1000 may include an electronic module disposed in an area overlapping the sensing area 1000SA. The electronic module may receive an external input provided thereto from outside of the display device 1000 through the sensing area 1000SA or may output a signal through the sensing area 1000SA. As an example, the electronic module may be a camera module, a sensor that measures a distance between an object and the electronic module, such as a proximity sensor, a sensor that recognizes a part of a user's body, e.g., a fingerprint, an iris, or a face, or a small lamp that outputs a light. However, the electronic module is not limited thereto. The electronic module may also be referred to herein as an input/output device.

A thickness direction of the display device 1000 may be substantially parallel to a third direction DR3 crossing the first direction DR1 and the second direction DR2. Front (or upper) and rear (or lower) surfaces of each member of the display device 1000 may be distinguished from each other with respect to the third direction DR3.

Figure 2:
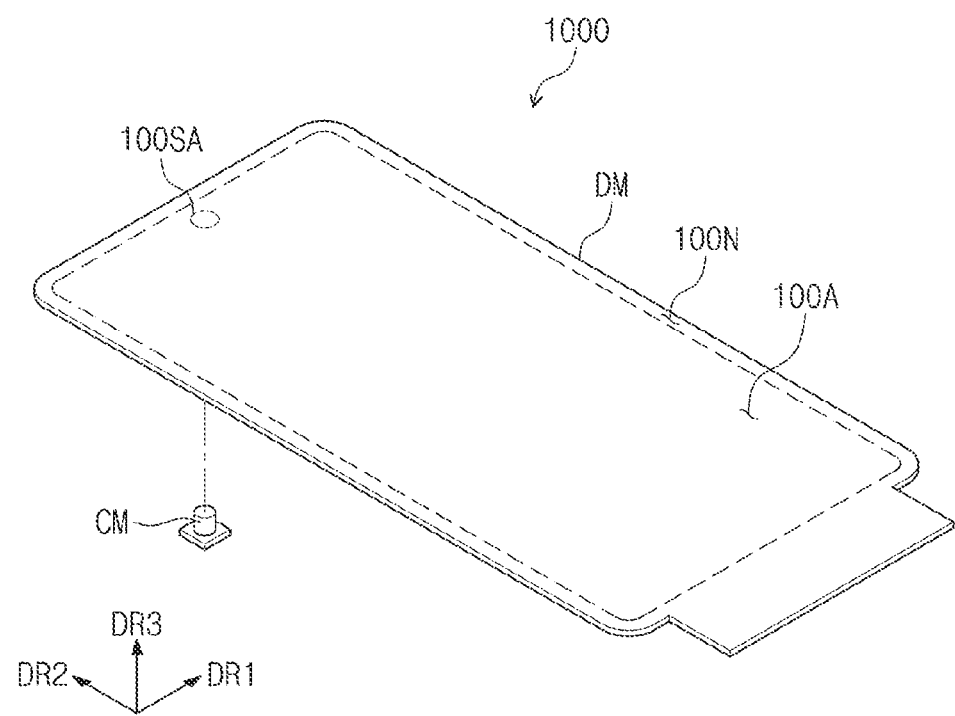
FIG. 2 is an exploded perspective view showing some components of a display device according to an embodiment of the present disclosure.

FIG. 2 is an exploded perspective view showing some components of the display device 1000 according to an embodiment of the present disclosure.

Referring to FIG. 2, the display device 1000 may include a display module DM and an electronic module CM. The display module DM may generate the image and may sense the external input applied thereto from outside of the display device 1000. The electronic module CM may be disposed under the display module DM. As an example, the electronic module CM may be a camera module or an infrared sensor module. Hereinafter, the display module DM may be referred to as a first electronic module, and the electronic module CM may be referred to as a second electronic module.

The display module DM may include a display area 100A and a peripheral area 100N, which are defined therein. The display area 100A may correspond to the display area 1000A shown in FIG. 1. An area of the display module DM may have a transmittance higher than that of the other area thereof and may be defined as a sensing area 100SA. The sensing area 100SA may be a portion of the display area 100A. The sensing area 100SA of the display module DM may correspond to the sensing area 1000SA of the display device 1000 shown in FIG. 1. The sensing area 100SA may display the image and may transmit the external input applied to the electronic module CM and/or the output from the electronic module CM.

Figure 3:
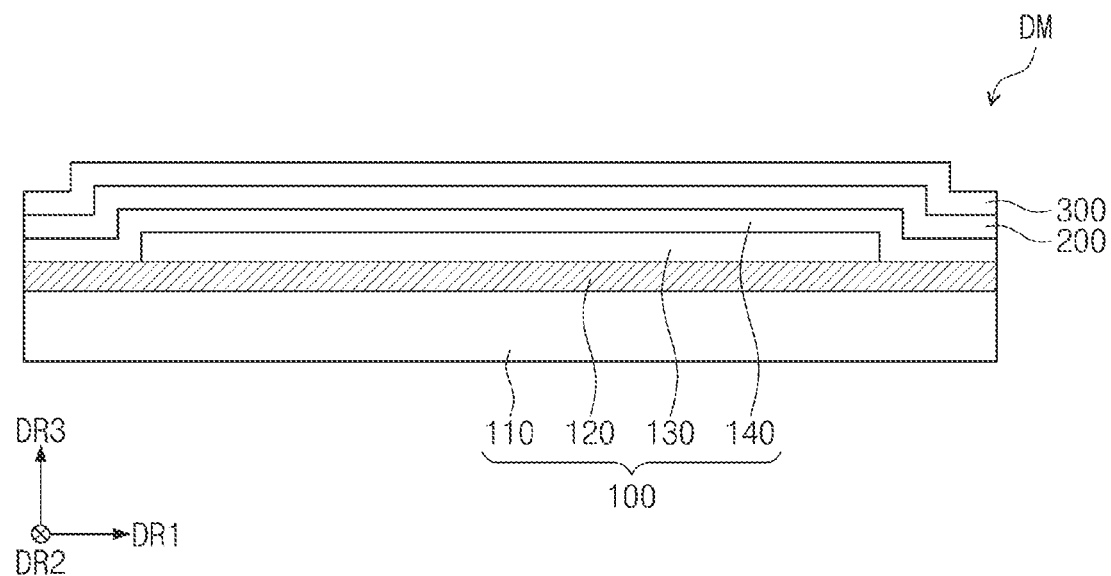
FIG. 3 is a cross-sectional view showing a display module according to an embodiment of the present disclosure.

FIG. 3 is a cross-sectional view showing the display module DM according to an embodiment of the present disclosure.

Referring to FIG. 3, the display module DM may include a display panel 100, a sensor layer 200, and an anti-reflective layer 300.

The display panel 100 may have a configuration that substantially generates the image. The display panel 100 may be a light emitting type display panel. As an example, the display panel 100 may be an organic light emitting display panel, an inorganic light emitting display panel, a quantum dot display panel, a micro-LED display panel, or a nano-LED display panel. The display panel 100 may be referred to as a display layer.

The display panel 100 may include a base layer 110, a circuit layer 120, a light emitting element layer 130, and an encapsulation layer 140.

The base layer 110 may be a member that provides a base surface on which the circuit layer 120 is disposed. The base layer 110 may be a rigid substrate or a flexible substrate that is bendable, foldable, or rollable. The base layer 110 may be, for example, a glass substrate, a metal substrate, or a polymer substrate. However, the base layer 110 is not limited thereto. For example, according to an embodiment, the base layer 110 may be an inorganic layer, an organic layer, or a composite material layer.

The base layer 110 may have a multi-layer structure. For example, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include at least one of, for example, an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In the present disclosure, the term "X-based resin", as used herein, refers to the resin that includes a functional group of X.

The circuit layer 120 may be disposed on the base layer 110. The circuit layer 120 may include, for example, an insulating layer, a semiconductor pattern, a conductive pattern, and a signal line. An insulating layer, a semiconductor layer, and a conductive layer may be formed on the base layer 110 by a coating or depositing process. Then, the insulating layer, the semiconductor layer, and the conductive layer may be selectively patterned through several photolithography processes. Thus, the semiconductor pattern, the conductive pattern, and the signal line included in the circuit layer 120 may be formed.

The light emitting element layer 130 may be disposed on the circuit layer 120. The light emitting element layer 130 may include a light emitting element. As an example, the light emitting element layer 130 may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from moisture, oxygen, and a foreign substance such as dust particles.

The sensor layer 200 may be disposed on the display panel 100. The sensor layer 200 may sense an external input applied thereto from outside of the display device 1000. For example, the external input may be a user input. The user input may include a variety of external inputs, such as, for example, a part of a user's body, light, heat, pen, or pressure.

The sensor layer 200 may be formed on the display panel 100 through successive processes. In this case, the sensor layer 200 may be disposed directly on the display panel 100. In the present disclosure, the expression "the sensor layer 200 is disposed directly on the display panel 100" means that no intervening elements are present between the sensor layer 200 and the display panel 100. That is, in an embodiment, a separate adhesive member is not disposed between the sensor layer 200 and the display panel 100. According to an embodiment, the sensor layer 200 may be coupled to the display panel 100 by an adhesive member. The adhesive member may include an ordinary adhesive.

The anti-reflective layer 300 may be disposed on the sensor layer 200. The anti-reflective layer 300 may reduce a reflectance with respect to the external light incident to the display module DM from outside of the display device 1000. The anti-reflective layer 300 may be formed on the sensor layer 200 through successive processes. The anti-reflective layer 300 may include color filters. The color filters may be arranged in a predetermined arrangement. The arrangement of the color filters may be determined by taking into account colors of lights emitted from pixels included in the display panel 100. In addition, the anti-reflective layer 300 may further include a black matrix adjacent to the color filters.

The anti-reflective layer 300 may include a retarder and a polarizer. The retarder may be a film type or liquid crystal coating type and may include a $\lambda/2$ retarder and/or a $\lambda/4$ retarder. The polarizer may be a film type or liquid crystal coating type. The film type polarizer and the film type retarder may include a stretching type synthetic resin film, and the liquid crystal coating type polarizer and the film type retarder may include liquid crystals aligned in a predetermined alignment. The retarder and the polarizer may be implemented as one polarizing film. The anti-reflective layer 300 may further include a protective film disposed above or under the polarizing film.

According to an embodiment, the sensor layer 200 may be omitted. In this case, the anti-reflective layer 300 may be disposed on the display panel 100. As an example, the anti-reflective layer 300 may be disposed directly on the display panel 100 through successive processes.

According to an embodiment, positions of the sensor layer 200 and the anti-reflective layer 300 may be changed with each other. As an example, the anti-reflective layer 300 may be disposed between the display panel 100 and the sensor layer 200.

According to an embodiment, the display module DM may further include an optical layer disposed on the anti-reflective layer 300. As an example, the optical layer may be formed on the anti-reflective layer 300 through successive processes. The optical layer may control a direction of a light incident from the display panel 100 to increase a front luminance of the display module DM. As an example, the optical layer may include an organic insulating layer through which openings are defined to respectively correspond to light emitting areas of the pixels included in the display panel 100 and a high refractive index layer covering the organic insulating layer and filled in the openings. The high refractive index layer may have a refractive index higher than that of the organic insulating layer.

Figure 4:
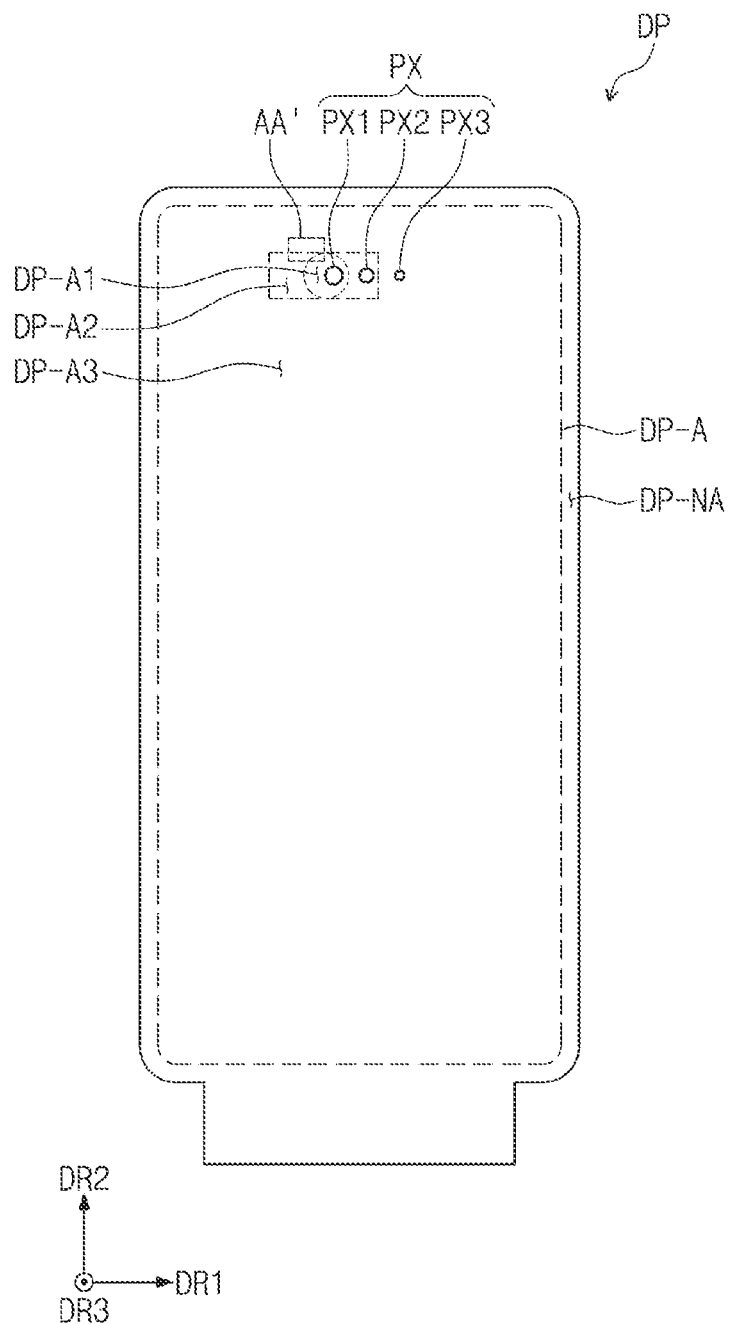
FIG. 4 is a plan view showing a display panel according to an embodiment of the present disclosure.
Figure 5:
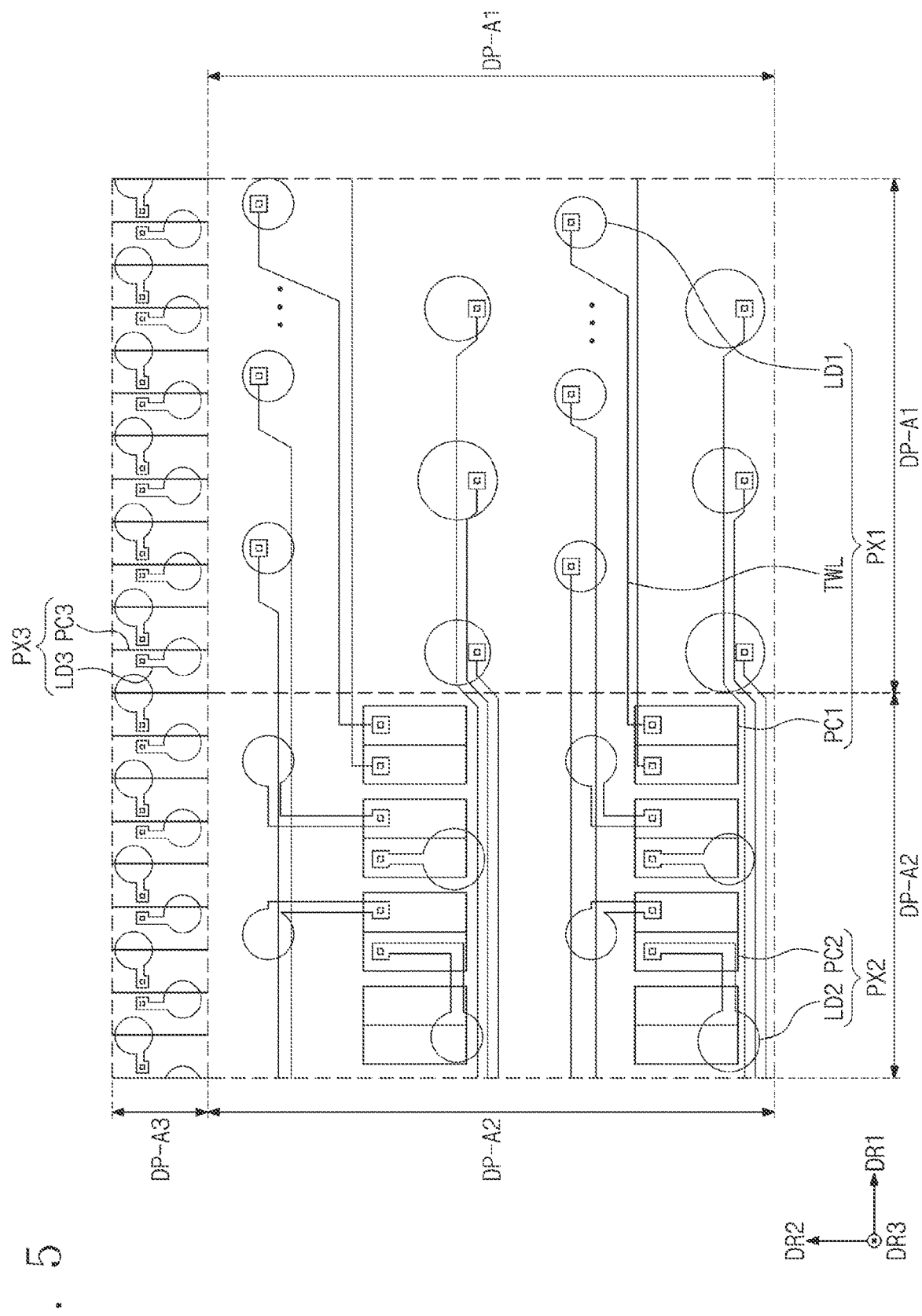
FIG. 5 is an enlarged plan view showing a portion of the display panel according to an embodiment of the present disclosure.

FIG. 4 is a plan view showing the display panel DP according to an embodiment of the present disclosure. FIG. 5 is an enlarged plan view showing a portion of the display panel DP according to an embodiment of the present disclosure. FIG. 5 is an enlarged plan view showing an area AA' of FIG. 4.

Referring to FIGS. 4 and 5, the display panel 100 (refer to FIG. 3) may include a display area DP-A and a peripheral area DP-NA. The peripheral area DP-NA may be defined adjacent to the display area DP-A and may surround at least a portion of the display area DP-A.

The display area DP-A may include a first display area DP-A1, a second display area DP-A2, and a main display area DP-A3. The first display area DP-A1 may be referred to as a component area, the second display area DP-A2 may be referred to as an intermediate area or a transition area, and the main display area DP-A3 may be referred to as a general display area or a third display area DP-A3. The first display area DP-A1 and the second display area DP-A2 may be referred to as an auxiliary display area.

The display panel 100 may include a plurality of pixels PX. The pixels PX may include a first pixel PX1 emitting a light in the first display area DP-A1, a second pixel PX2 emitting a light in the second display area DP-A2, and a third pixel PX3 emitting a light in the main display area DP-A3.

Each of the first pixel PX1, the second pixel PX2, and the third pixel PX3 may be provided in plural. In this case, each of the first, second, and third pixels PX1, PX2, and PX3 may include a red pixel, a green pixel, and a blue pixel, and may further include a white pixel according to an embodiment.

The first pixel PX1 may include a first light emitting element LD1 and a first pixel circuit PC1 that drives the first light emitting element LD1. The second pixel PX2 may include a second light emitting element LD2 and a second pixel circuit PC2 that drives the second light emitting element LD2, and the third pixel PX3 may include a third light emitting element LD3 and a third pixel circuit PC3 that drives the third light emitting element LD3. Positions of the first pixel PX1, the second pixel PX2, and the third pixel PX3 shown in FIG. 4 are illustrated to correspond to positions of the first, second, and third light emitting elements LD1, LD2, and LD3.

The first display area DP-A1 may overlap or correspond to the sensing area 1000SA shown in FIG. 1. That is, the first display area DP-A1 may be provided in an area overlapping the electronic module CM (refer to FIG. 2) when viewed in a plane. As an example, an external input, e.g., a light, may be provided to the electronic module CM via the first display area DP-A1, and an output from the electronic module CM may exit the display device 1000 via the first display area DP-A1. In an embodiment, the first display area DP-A1 is shown as a circular shape. However, the shape of the first display area DP-A1 is not limited thereto. For example, according to an embodiment, the first display area DP-A1 may have a variety of shapes, such as a polygonal shape, an oval shape, a shape having at least one curved side, or an irregular shape.

The number of pixels provided in the first display area DP-A1 may be smaller than that provided in the main display area DP-A3 to secure a size of the transmission area. An area in which the first light emitting element LD1 is not disposed in the first display area DP-A1 may be defined as a transmission area TA (refer to FIG. 8). As an example, an area in which a lower electrode of the first light emitting element LD1 and a pixel definition pattern surrounding the lower electrode are not disposed in the first display area DP-A1 may be defined as the transmission area TA (refer to FIG. 8).

The number of the first pixels PX1 disposed in the first display area DP-A1 per a unit area or the same area may be smaller than the number of the third pixels PX3 disposed in the main display area DP-A3 per the unit area or the same area. As an example, a resolution of the first display area DP-A1 may be about $\frac{1}{2}$, about $\frac{3}{8}$, about $\frac{1}{3}$, about $\frac{1}{4}$, about $\frac{2}{9}$, about $\frac{1}{8}$, about $\frac{1}{9}$, or about $\frac{1}{16}$ of a resolution of the main display area DP-A3. For example, the resolution of the main display area DP-A3 may be equal to or greater than about 400 ppi, and the resolution of the first display area DP-A1 may be about 200 ppi or about 100 ppi. However, this is merely one example, and embodiments of the present disclosure are not limited thereto.

According to an embodiment, the first pixel circuit PC1 of the first pixel PX1 is not disposed in the first display area DP-A1. As an example, the first pixel circuit PC1 may be disposed in the second display area DP-A2 or the peripheral area DP-NA. In this case, a light transmittance of the first display area DP-A1 may increase more than when the first pixel circuit PC1 is disposed in the first display area DP-A1.

The first light emitting element LD1 may be electrically connected to the first pixel circuit PC1 via a connection line TWL. The connection line TWL may overlap a transmission area of the first display area DP-A1. The connection line TWL may include a transparent conductive line. The transparent conductive line may include a transparent conductive material or a light transmissive material. As an example, the connection line TWL may include a transparent conductive oxide (TCO), such as indium tin oxide (ITO), indium zinc oxide (IZO), indium gallium zinc oxide (IGZO), zinc oxide (ZnO), indium oxide ($In_2O_3$), etc.

The second display area DP-A2 may be defined adjacent to the first display area DP-A1. The second display area DP-A2 may surround at least a portion of the first display area DP-A1. The second display area DP-A2 may have a transmittance lower than that of the first display area DP-A1. In an embodiment, the second display area DP-A2 may be spaced apart from the peripheral area DP-NA. However, embodiments of the present disclosure are not be limited thereto. For example, according to an embodiment, the second display area DP-A2 may be in contact (e.g., direct contact) with the peripheral area DP-NA.

The first pixel circuit PC1 of the first pixel PX1, the second light emitting element LD2, and the second pixel circuit PC2 may be disposed in the second display area DP-A2. Accordingly, the light transmittance of the second display area DP-A2 may be lower than the light transmittance of the first display area DP-A1. In addition, as the first pixel circuit PC1 of the first pixel PX1 is disposed in the second display area DP-A2, the number of the second pixels PX2 disposed in the second display area DP-A2 per the unit area or the same area may be smaller than the number of the third pixels PX3 disposed in the main display area DP-A3 per the unit area or the same area. The resolution of the image displayed in the second display area DP-A2 may be lower than the resolution of the image displayed in the main display area DP-A3.

The main display area DP-A3 may be adjacent to the second display area DP-A2. The main display area DP-A3 may be adjacent to the first display area DP-A1. The main display area DP-A3 may have a transmittance lower than a transmittance of the first display area DP-A1. The third light emitting element LD3 and the third pixel circuit PC3 may be disposed in the third display area DP-A3.

According to an embodiment, the first light emitting element LD1 disposed in the first display area DP-A1 that is nearest to the main display area DP-A3 may have a circular shape with a larger width in a specific direction to secure a distance from the third light emitting element LD3 disposed in the main display area DP-A3. As an example, in a case where the first display area DP-A1 is disposed adjacent to the main display area DP-A3 in the second direction DR2, a width in the first direction DR1 of the first light emitting element LD1 may be greater than a width in the second direction DR2 of the first light emitting element LD1.

Each of the first light emitting element LD1, the second light emitting element LD2, and the third light emitting element LD3 may be provided in plural. A distance between two first light emitting elements nearest to each other among the first light emitting elements LD1 may be greater than a distance between two third light emitting elements nearest to each other among the third light emitting elements LD3. In addition, a distance between two second light emitting elements nearest to each other among the second light emitting elements LD2 may be greater than the distance between the two third light emitting elements nearest to each other among the third light emitting elements LD3.

The first, second, and third light emitting elements LD1, LD2, and LD3 shown in FIG. 5 may have shapes respectively corresponding to shapes of a first lower electrode AE1 (refer to FIG. 8) of the first light emitting element LD1, a second lower electrode AE2 (refer to FIG. 8) of the second light emitting element LD2, and a third lower electrode AE3 (refer to FIG. 7) of the third light emitting element LD3, respectively. An area of the first lower electrode AE1 (refer to FIG. 8) may be greater than an area of the third lower electrode AE3 (refer to FIG. 7).

Figure 6:
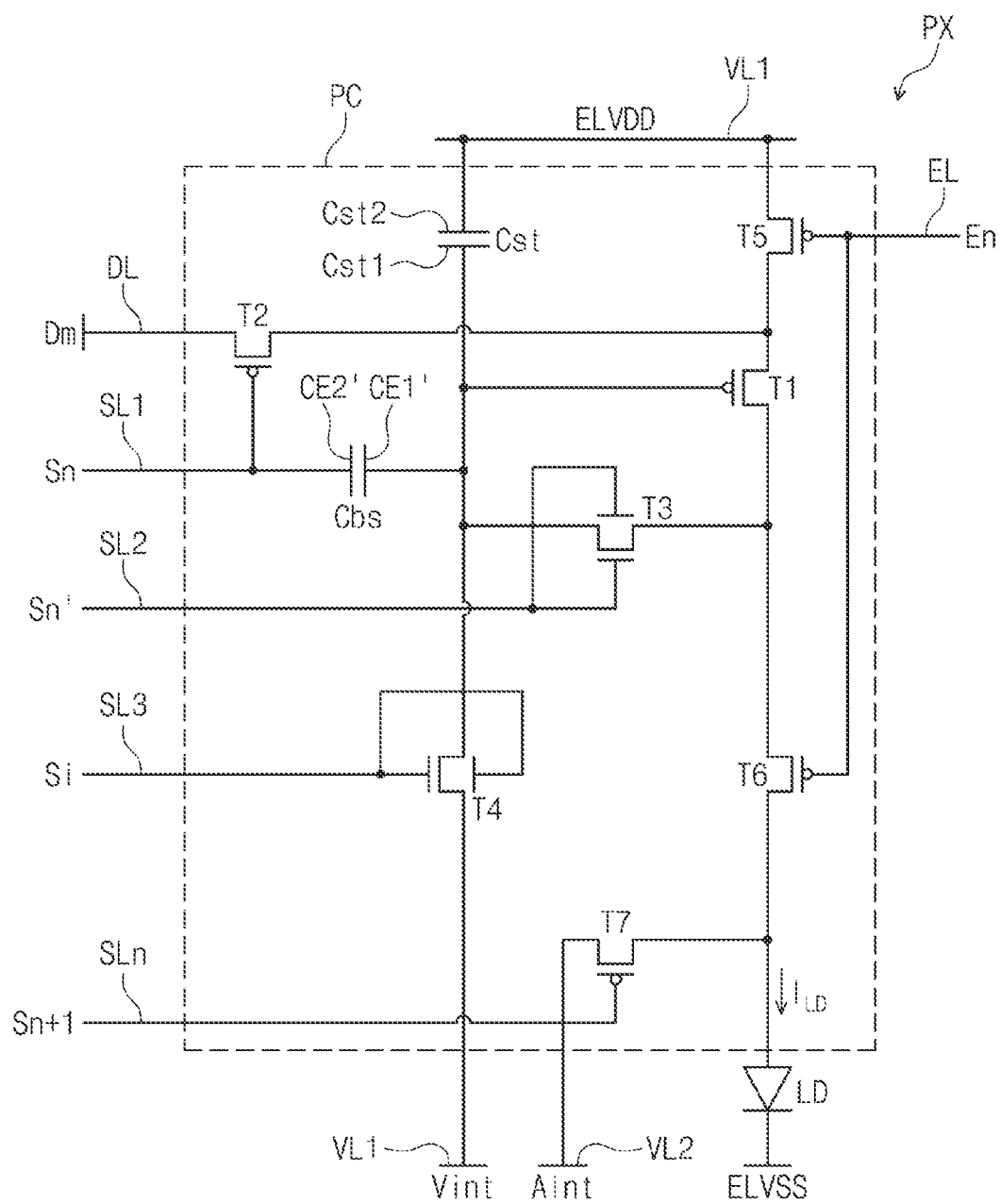
FIG. 6 is an equivalent circuit diagram showing a pixel according to an embodiment of the present disclosure.

FIG. 6 is an equivalent circuit diagram showing a pixel PX according to an embodiment of the present disclosure.

FIG. 6 shows an equivalent circuit diagram of one pixel PX among the pixels PX. The pixel PX shown in FIG. 6 may be the first pixel PX1 (refer to FIG. 4), the second pixel PX2 (refer to FIG. 4), or the third pixel PX3 (refer to FIG. 4). The pixel PX may include a light emitting element LD and a pixel circuit PC. The light emitting element LD may be a component included in the light emitting element layer 130 of FIG. 3, and the pixel circuit PC may be a component included in the circuit layer 120 of FIG. 3.

The pixel circuit PC may include a plurality of thin film transistors T1, T2, T3, T4, T5, T6, and T7 and a storage capacitor Cst. The thin film transistors T1 to T7 and the storage capacitor Cst may be electrically connected to signal lines SL1, SL2, SL3, SLn, EL, and DL, where n is a positive integer, a first initialization voltage line VL1, a second initialization voltage line VL2 (or referred to as an anode initialization voltage line), and a driving voltage line PL. According to an embodiment, at least one of the lines, e.g., the driving voltage line PL, may be shared by adjacent pixels PX.

The thin film transistors T1 to T7 may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The light emitting element LD may include a lower electrode, e.g., an anode electrode or a pixel electrode, and an upper electrode, e.g., a cathode electrode or a common electrode. The lower electrode of the light emitting element LD may be connected to the driving thin film transistor T1 via the emission control thin film transistor T6 to receive a driving current $I_{LD}$, and the upper electrode may receive a low power voltage ELVSS. The light emitting element LD may generate a light having a luminance corresponding to the driving current $I_{LD}$.

Some thin film transistors of the thin film transistors T1 to T7 may be an n-channel MOSFET (NMOS), and the other thin film transistors of the thin film transistors T1 to T7 may be a p-channel MOSFET (PMOS). As an example, the compensation thin film transistor T3 and the first initialization thin film transistor T4 among the thin film transistors T1 to T7 may be the n-channel MOSFET (NMOS), and the other thin film transistors among the thin film transistors T1 to T7 may be the p-channel MOSFET (PMOS).

According to an embodiment, among the thin film transistors T1 to T7, the compensation thin film transistor T3, the first initialization thin film transistor T4, and the second initialization thin film transistor T7 may be the NMOS, and the other thin film transistors may be the PMOS. According to an embodiment, among the thin film transistors T1 to T7, only one thin film transistor may be the NMOS, and the other thin film transistors may be the PMOS. According to an embodiment, all the thin film transistors T1 to T7 may be the NMOS or the PMOS.

The signal lines may include a first scan line SL1 transmitting a first scan signal Sn, a second scan line SL2 transmitting a second scan signal Sn', a third scan line SL3 transmitting a third scan signal Si to the first initialization thin film transistor T4, an emission control line EL transmitting an emission control signal En to the operation control thin film transistor T5 and the emission control thin film transistor T6, a next scan line SLn transmitting a next scan signal Sn+1 to the second initialization thin film transistor T7, and a data line DL crossing the first scan line SL1 and transmitting a data signal Dm. The first scan signal Sn may be a present scan signal, and the next scan signal Sn+1 may be a next scan signal of the first scan signal Sn.

The driving voltage line PL may transmit a driving voltage ELVDD to the driving thin film transistor T1, and the first initialization voltage line VL1 may transmit an initialization voltage Vint to initialize the driving thin film transistor T1 and the pixel electrode.

A driving gate electrode of the driving thin film transistor T1 may be connected to the storage capacitor Cst, a driving source area of the driving thin film transistor T1 may be connected to the driving voltage line PL via the operation control thin film transistor T5, and a driving drain area of the driving thin film transistor T1 may be electrically connected to the pixel electrode of the light emitting element LD via the emission control thin film transistor T6. The driving thin film transistor T1 may receive the data signal Dm in response to a switching operation of the switching thin film transistor T2 and may supply the driving current $I_{LD}$ to the light emitting element LD.

A switching gate electrode of the switching thin film transistor T2 may be connected to the first scan line SL1 transmitting the first scan signal Sn, a switching source area of the switching thin film transistor T2 may be connected to the data line DL, and a switching drain area of the switching thin film transistor T2 may be connected to the driving source area of the driving thin film transistor T1 and may be connected to the driving voltage line PL via the operation control thin film transistor T5. The switching thin film transistor T2 may be turned on in response to the first scan signal Sn applied thereto through the first scan line SL1 and may perform the switching operation to transmit the data signal Dm applied to the data line DL to the driving source area of the driving thin film transistor T1.

A compensation gate electrode of the compensation thin film transistor T3 may be connected to the second scan line SL2. A compensation drain area of the compensation thin film transistor T3 may be connected to the driving drain area of the driving thin film transistor T1 and may be connected to the pixel electrode of the light emitting element LD via the emission control thin film transistor T6. A compensation source area of the compensation thin film transistor T3 may be connected to a first electrode Cst1 of the storage capacitor Cst and the driving gate electrode of the driving thin film transistor T1. In addition, the compensation source area of the compensation thin film transistor T3 may be connected to a first initialization drain area of the first initialization thin film transistor T4.

The compensation thin film transistor T3 may be turned on in response to the second scan signal Sn' applied thereto via the second scan line SL2, and may electrically connect the driving gate electrode and the driving drain area of the driving thin film transistor T1 to allow the driving thin film transistor T1 to be connected in a diode configuration.

A first initialization gate electrode of the first initialization thin film transistor T4 may be connected to the third scan line SL3. A first initialization source area of the first initialization thin film transistor T4 may be connected to a second initialization source area of the second initialization thin film transistor T7 and the first initialization voltage line VL1. The first initialization drain area of the first initialization thin film transistor T4 may be connected to the first electrode Cst1 of the storage capacitor Cst, the compensation source area of the compensation thin film transistor T3, and the driving gate electrode of the driving thin film transistor T1. The first initialization thin film transistor T4 may be turned on in response to the third scan signal Si applied thereto through the third scan line SL3 and may transmit the initialization voltage Vint to the driving gate electrode of the driving thin film transistor T1 to perform an initialization operation that initializes a voltage of the driving gate electrode of the driving thin film transistor T1.

An operation control gate electrode of the operation control thin film transistor T5 may be connected to the emission control line EL, an operation control source area of the operation control thin film transistor T5 may be connected to the driving voltage line PL, and an operation control drain area of the operation control thin film transistor T5 may be connected to the driving source area of the driving thin film transistor T1 and the switching drain area of the switching thin film transistor T2.

An emission control gate electrode of the emission control thin film transistor T6 may be connected to the emission control line EL, an emission control source area of the emission control thin film transistor T6 may be connected to the driving drain area of the driving thin film transistor T1 and the compensation drain area of the compensation thin film transistor T3, and an emission control drain area of the emission control thin film transistor T6 may be connected to a second initialization drain area of the second initialization thin film transistor T7 and the pixel electrode of the light emitting element LD.

The operation control thin film transistor T5 and the emission control thin film transistor T6 may be substantially simultaneously turned on in response to the emission control signal En applied thereto via the emission control line EL, and the driving voltage ELVDD may be applied to the light emitting element LD to allow the driving current $I_{LD}$ to flow through the light emitting element LD.

A second initialization gate electrode of the second initialization thin film transistor T7 may be connected to the next scan line SLn, the second initialization drain area of the second initialization thin film transistor T7 may be connected to the emission control drain area of the emission control thin film transistor T6 and the pixel electrode of the light emitting element LD, and the second initialization source area of the second initialization thin film transistor T7 may be connected to the second initialization voltage line VL2 to receive an anode initialization voltage Vint2. The second initialization thin film transistor T7 may be turned on in response to the next scan signal Sn+1 applied thereto via the next scan line SLn to initialize the pixel electrode of the light emitting element LD.

According to an embodiment, the second initialization thin film transistor T7 may be connected to the emission control line EL and may be driven in response to the emission control signal En. Positions of the source areas and the drain areas may be changed with each other depending on the types, e.g., a p-type or an n-type, of the thin film transistor.

The storage capacitor Cst may include the first electrode Cst1 and a second electrode Cst2. The first electrode Cst1 of the storage capacitor Cst may be connected to the driving gate electrode of the driving thin film transistor T1, and the second electrode Cst2 of the storage capacitor Cst may be connected to the driving voltage line PL. The storage capacitor Cst may be charged with electric charges corresponding to a difference between the voltage of the driving gate electrode of the driving thin film transistor T1 and the driving voltage ELVDD.

A boosting capacitor Cbs may include a first electrode CE1' and a second electrode CE2'. The first electrode CE1' of the boosting capacitor Cbs may be connected to the first electrode Cst1 of the storage capacitor Cst, and the second electrode CE2' of the boosting capacitor Cbs may receive the first scan signal Sn. The boosting capacitor Cbs may boost the voltage of the driving gate electrode of the driving thin film transistor T1 at a time point at which the provision of the first scan signal Sn is stopped, and thus, a voltage drop at the driving gate electrode may be compensated for.

Detailed operations of each pixel PX according to an embodiment are described below.

When the third scan signal Si is provided via the third scan line SL3 during an initialization period, the first initialization thin film transistor T4 may be turned on in response to the third scan signal Si, and the driving thin film transistor T1 may be initialized by the initialization voltage Vint provided from the first initialization voltage line VL1.

When the first scan signal Sn and the second scan signal Sn' are provided via the first scan line SL1 and the second scan line SL2 during a data programming period, the switching thin film transistor T2 and the compensation thin film transistor T3 may be turned on in response to the first scan signal Sn and the second scan signal Sn'. In this case, the driving thin film transistor T1 may be connected in a diode configuration by the turned-on compensation thin film transistor T3 and may be forward biased.

Then, a compensation voltage Dm+Vth (Vth is a negative (−) value), which is obtained by subtracting a threshold voltage Vth of the driving thin film transistor T1 from the data signal Dm provided from the data line DL, may be applied to the driving gate electrode of the driving thin film transistor T1.

The driving voltage ELVDD and the compensation voltage Dm+Vth may be respectively applied to both ends of the storage capacitor Cst, and the storage capacitor Cst may be charged with electric charges corresponding to a difference in voltage between both ends thereof.

During a light emitting period, the operation control thin film transistor T5 and the emission control thin film transistor T6 may be turned on by the emission control signal En provided from the emission control line EL. The driving current $I_{LD}$ may be generated according to the difference between the voltage of the driving gate electrode of the driving thin film transistor T1 and the driving voltage ELVDD, and the driving current $I_{LD}$ may be supplied to the light emitting element LD via the emission control thin film transistor T6.

According to an embodiment, at least one thin film transistor of the thin film transistors T1 to T7 may include a semiconductor layer containing oxide, and the other thin film transistors of the thin film transistors T1 to T7 may include a semiconductor layer containing silicon.

For example, the driving thin film transistor T1, which directly affects the luminance of the display device, may include the semiconductor layer containing polycrystalline silicon with high reliability, and thus, a display device with high resolution may be implemented.

Since an oxide semiconductor has a high carrier mobility and a low leakage current, the voltage drop is not large even though the driving time is long. That is, even when the pixels PX are driven at low frequency, a change in color of the image due to the voltage drop is not large, and thus, the pixels PX may be driven at low frequency.

As described above, since the oxide semiconductor has low leakage current, at least one of the compensation thin film transistor T3, the first initialization thin film transistor T4, and the second initialization thin film transistor T7, which are connected to the driving gate electrode of the driving thin film transistor T1, may include the oxide semiconductor. Thus, the leakage current may be prevented from flowing to the driving gate electrode of the driving thin film transistor T1, and power consumption may be reduced.

Figure 7:
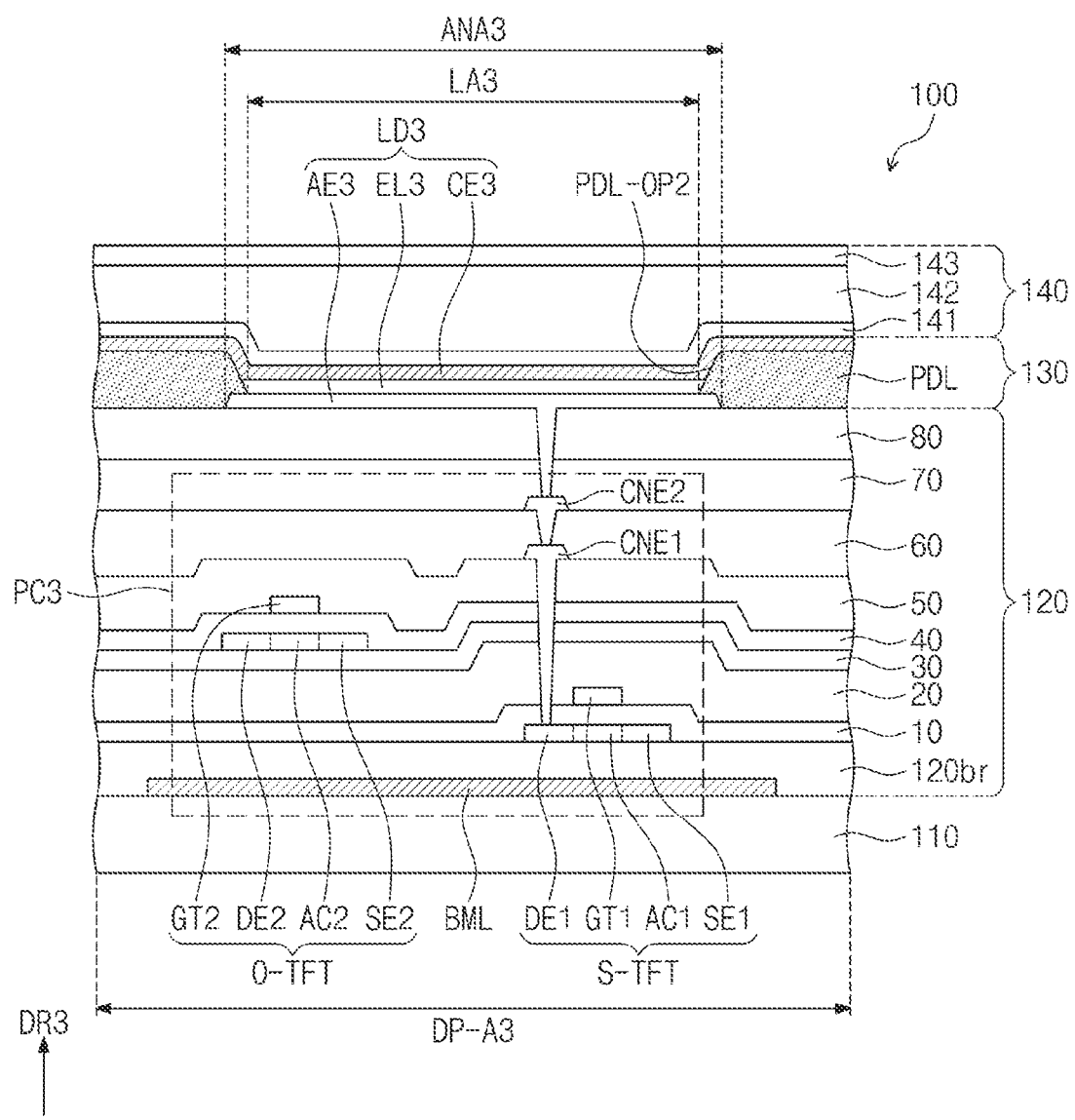
FIG. 7 is a cross-sectional view showing a display panel according to an embodiment of the present disclosure.
Figure 8:
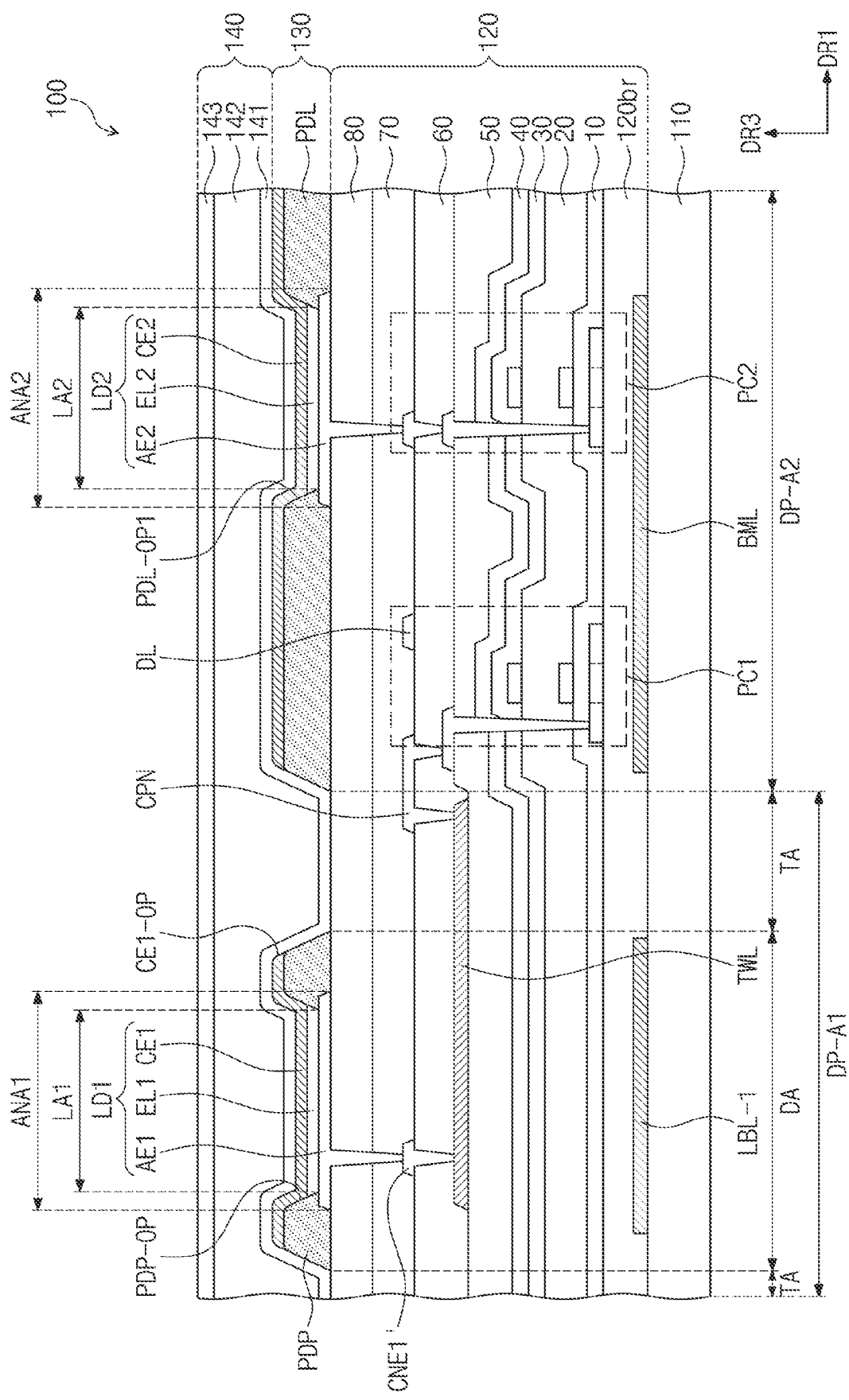
FIG. 8 is a cross-sectional view showing a display panel according to an embodiment of the present disclosure.

FIG. 7 is a cross-sectional view showing the display panel 100 according to an embodiment of the present disclosure. FIG. 8 is a cross-sectional view showing the display panel 100 according to an embodiment of the present disclosure. FIG. 7 is a cross-sectional view showing a portion of the display panel 100, which includes the main display area DP-A3, and FIG. 8 is a cross-sectional view showing a portion of the display panel 100, which includes the first display area DP-A1 and the second display area DP-A2.

Referring to FIGS. 7 and 8, the display panel 100 may include a plurality of insulating layers, a semiconductor pattern, a conductive pattern, and a signal line. An insulating layer, a semiconductor layer, and a conductive layer may be formed by a coating or depositing process. Then, the insulating layer, the semiconductor layer, and the conductive layer may be selectively patterned through several photolithography processes. Thus, the semiconductor pattern, the conductive pattern, and the signal line included in the circuit layer 120 and the light emitting element layer 130 may be formed. Then, the encapsulation layer 140 may be formed to cover the light emitting element layer 130.

FIG. 7 shows the third light emitting element LD3 and a silicon thin film transistor S-TFT and an oxide thin film transistor O-TFT of the third pixel circuit PC3 (refer to FIG. 5). FIG. 8 shows the first light emitting element LD1, the first pixel circuit PC1, the second light emitting element LD2, and the second pixel circuit PC2.

A buffer layer 120br may be disposed on the base layer 110. The buffer layer 120br may prevent metal atoms or impurities from being diffused to a first semiconductor pattern from the base layer 110. In addition, the buffer layer 120br may control a rate of heat supply during a crystallization process to form the first semiconductor pattern so that the first semiconductor pattern may be uniformly formed.

A light blocking layer may be disposed between the base layer 110 and the buffer layer 120br. The light blocking layer may include a plurality of first light blocking patterns LBL-1 and a plurality of second light blocking patterns BML. The first light blocking patterns LBL-1 may be disposed in the first display area DP-A1. The second light blocking patterns BML may be disposed in the second and third display areas DP-A2 and DP-A3. According to an embodiment, the second light blocking patterns BML may be disposed on the base layer 110 and may correspond to a rear surface metal layer BML overlapping the first, second, and third pixel circuits PC1, PC2, and PC3 to protect the first, second, and third pixel circuits PC1, PC2, and PC3. The rear surface metal layer BML may block the external light from reaching the first, second, and third pixel circuits PC1, PC2, and PC3. For example, the rear surface metal layer BML may prevent an electric potential caused by a polarization phenomenon of the base layer 110 from exerting influence on the first, second, and third pixel circuits PC1, PC2, and PC3. The rear surface metal layer BML may include, for example, molybdenum (Mo), titanium (Ti), aluminum (AL), silver (Ag), copper (Cu), etc.

The first light blocking patterns LBL-1 and the second light blocking patterns BML, which are included in the light blocking layer, may be formed through the same process. That is, the first light blocking patterns LBL-1 disposed in the first display area DP-A1 may be patterned together with the rear surface metal layer BML disposed in the second and third display areas DP-A2 and DP-A3 on the base layer 110. The first light blocking patterns LBL-1 may include the same materials or metals as those of the rear surface metal layer BML.

The first semiconductor pattern may be disposed on the buffer layer 120br. The first semiconductor pattern may include a silicon semiconductor. As an example, the silicon semiconductor may include amorphous silicon or polycrystalline silicon. For example, the first semiconductor pattern may include low temperature polycrystalline silicon.

FIG. 7 shows a portion of the first semiconductor pattern disposed on the buffer layer 120br. The first semiconductor pattern may be further disposed in other areas. The first semiconductor pattern may be arranged with a specific rule over the pixels. The first semiconductor pattern may have different electrical properties depending on whether it is doped, or whether it is doped with an N-type dopant or a P-type dopant. The first semiconductor pattern may include a first region having a relatively high conductivity and a second region having a relatively low conductivity. The first region may be doped with the N-type dopant or the P-type dopant. A P-type transistor may include a region doped with the P-type dopant, and an N-type transistor may include a region doped with the N-type dopant. The second region may be a non-doped region or a region doped at a concentration lower than that of the first region.

The first region may have a conductivity greater than that of the second region and may substantially serve as an electrode or signal line. The second region may substantially correspond to an active area (or a channel) of the transistor. For example, a portion of the semiconductor pattern may be the active area of the transistor, another portion of the semiconductor pattern may be a source or a drain of the transistor, and the other portion of the semiconductor pattern may be a connection electrode or a connection signal line.

A source area SE1, an active area AC1, and a drain area DE1 of the silicon thin film transistor S-TFT may be formed from the first semiconductor pattern. The source area SE1 and the drain area DE1 may extend in opposite directions to each other from the active area AC1 in a cross-section.

A first insulating layer 10 may be disposed on the buffer layer 120br. The first insulating layer 10 may commonly overlap the pixels and may cover the first semiconductor pattern. The first insulating layer 10 may be an inorganic layer and/or an organic layer and may have a single-layer or multi-layer structure. The first insulating layer 10 may include at least one of, for example, aluminum oxide, titanium oxide, silicon oxide, silicon nitride, silicon oxynitride, zirconium oxide, and hafnium oxide. In an embodiment, the first insulating layer 10 may have a single-layer structure of a silicon oxide layer. Not only the first insulating layer 10, but also an insulating layer of the circuit layer 120 described below may be an inorganic layer and/or an organic layer and may have a single-layer or multi-layer structure. The inorganic layer may include at least one of the above-mentioned materials. However, the inorganic layer is not limited thereto.

A gate GT1 of the silicon thin film transistor S-TFT may be disposed on the first insulating layer 10. The gate GT1 may be a portion of a metal pattern. The gate GT1 may overlap the active area AC1. The gate GT1 may be used as a mask in a process of doping the first semiconductor pattern. The gate GT1 may include, for example, titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), indium zinc oxide (IZO), etc.

A second insulating layer 20 may be disposed on the first insulating layer 10 and may cover the gate GT1. The second insulating layer 20 may be an inorganic layer and/or an organic layer and may have a single-layer or multi-layer structure. The second insulating layer 20 may include at least one of, for example, silicon oxide, silicon nitride, and silicon oxynitride. In an embodiment, the second insulating layer 20 may have a multi-layer structure including a silicon oxide layer and a silicon nitride layer.

A third insulating layer 30 may be disposed on the second insulating layer 20. The third insulating layer 30 may have a single-layer or multi-layer structure. As an example, the third insulating layer 30 may have a multi-layer structure including a silicon oxide layer and a silicon nitride layer. The second electrode Cst2 (refer to FIG. 6) of the storage capacitor Cst (refer to FIG. 6) may be disposed between the second insulating layer 20 and the third insulating layer 30. In addition, the first electrode Cst1 (refer to FIG. 6) of the storage capacitor Cst (refer to FIG. 6) may be disposed between the first insulating layer 10 and the second insulating layer 20.

A second semiconductor pattern may be disposed on the third insulating layer 30. The second semiconductor pattern may include an oxide semiconductor. A source area SE2, an active area AC2, and a drain area DE2 of the oxide thin film transistor O-TFT may be formed from the second semiconductor pattern. The source area SE2 and the drain area DE2 may extend in opposite directions to each other from the active area AC2 in a cross-section.

A fourth insulating layer 40 may be disposed on the third insulating layer 30. The fourth insulating layer 40 may commonly overlap the pixels and may cover the second semiconductor pattern. The fourth insulating layer 40 may include at least one of, for example, aluminum oxide, titanium oxide, silicon oxide, silicon nitride, silicon oxynitride, zirconium oxide, and hafnium oxide.

A second gate GT2 of the oxide thin film transistor O-TFT may be disposed on the fourth insulating layer 40. The second gate GT2 may be a portion of a metal pattern. The second gate GT2 may overlap the active area AC2. The second gate GT2 may be used as a mask in a process of doping the second semiconductor pattern.

A fifth insulating layer 50 may be disposed on the fourth insulating layer 40 and may cover the second gate GT2. The fifth insulating layer 50 may be an inorganic layer and/or an organic layer and may have a single-layer or multi-layer structure.

A first connection electrode CNE1 may be disposed on the fifth insulating layer 50. The first connection electrode CNE1 may be connected to the drain area DE1 of the silicon thin film transistor S-TFT via a contact hole defined through the first, second, third, fourth, and fifth insulating layers 10, 20, 30, 40, and 50.

A sixth insulating layer 60 may be disposed on the fifth insulating layer 50. A second connection electrode CNE2 may be disposed on the sixth insulating layer 60. The second connection electrode CNE2 may be connected to the first connection electrode CNE1 via a contact hole defined through the sixth insulating layer 60. A seventh insulating layer 70 may be disposed on the sixth insulating layer 60 and may cover the second connection electrode CNE2. An eighth insulating layer 80 may be disposed on the seventh insulating layer 70.

Each of the sixth insulating layer 60, the seventh insulating layer 70, and the eighth insulating layer 80 may be an organic layer. As an example, each of the sixth insulating layer 60, the seventh insulating layer 70, and the eighth insulating layer 80 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

The light emitting element layer 130 including the first, second, and third light emitting elements LD1, LD2, and LD3 may be disposed on the circuit layer 120. The first light emitting element LD1 may include the first lower electrode AE1, a first light emitting layer EL1, and a first upper electrode CE1, the second light emitting element LD2 may include the second lower electrode AE2, a second light emitting layer EL2, and a second upper electrode CE2, and the third light emitting element LD3 may include the third lower electrode AE3, a third light emitting layer EL3, and a third upper electrode CE3.

The first lower electrode AE1, the second lower electrode AE2, and the third lower electrode AE3 may be disposed on the eighth insulating layer 80. Each of the first lower electrode AE1, the second lower electrode AE2, and the third lower electrode AE3 may be a semi-transmissive electrode or a reflective electrode. According to an embodiment, each of the first lower electrode AE1, the second lower electrode AE2, and the third lower electrode AE3 may include a reflective layer formed of, for example, Ag, Mg, Al, Pt, Pd, Au, Ni, Nd, Ir, Cr, or compounds thereof, and a transparent or semi-transparent electrode layer formed on the reflective layer. The transparent or semi-transparent electrode layer may include at least one of, for example, indium tin oxide (ITO), indium zinc oxide (IZO), indium gallium zinc oxide (IGZO), zinc oxide (ZnO), indium oxide (In2O3), and aluminum-doped zinc oxide (AZO). For example, each of the first lower electrode AE1, the second lower electrode AE2, and the third lower electrode AE3 may include a three-layer structure of ITO/Ag/ITO. The first lower electrode AE1, the second lower electrode AE2, and the third lower electrode AE3 may define a first electrode area ANA1, a second electrode area ANA2, and a third electrode area ANA3, respectively. The first electrode area ANA1, the second electrode area ANA2, and the third electrode area ANA3 may correspond to areas respectively occupied by the first lower electrode AE1, the second lower electrode AE2, and the third lower electrode AE3 when viewed in the third direction DR3. Each of the first electrode area ANA1, the second electrode area ANA2, and the third electrode area ANA3 may have a size greater than that of each of a first light emitting area LA1, a second light emitting area LA2, and a third light emitting area LA3 described hereinafter when viewed in a plane. The plane may be a plane viewed in the third direction DR3.

A pixel definition layer PDL and a pixel definition pattern PDP may be disposed on the eighth insulating layer 80. The pixel definition layer PDL and the pixel definition pattern PDP may include the same material and may be formed through the same process. Each of the pixel definition layer PDL and the pixel definition pattern PDP may have a light absorbing property, for example, each of the pixel definition layer PDL and the pixel definition pattern PDP may have a black color. Each of the pixel definition layer PDL and the pixel definition pattern PDP may include a black coloring agent. The black coloring agent may include a black dye or a black pigment. The black coloring agent may include a metal material, such as, for example, carbon black, chromium, or an oxide thereof.

The pixel definition pattern PDP may be disposed in the first area DP-A1. The pixel definition pattern PDP may cover a portion of the first lower electrode AE1 of the light emitting element LD1. As an example, the pixel definition pattern PDP may cover an edge of the first lower electrode AE1.

The pixel definition pattern PDP may be provided with an opening PDP-OP to expose a portion of the first lower electrode AE1. An area where the first lower electrode AE1 is exposed through the opening PDP-OP may be defined as the first light emitting area LA1. The first light emitting area LA1 may be provided in plural, and the number of the first light emitting areas LA1 may correspond to the number of the first light emitting elements LD1.

According to an embodiment, each of the light emitting areas LA1 may be defined at the same position in each of the first lower electrodes AE1. As an example, a portion of the first lower electrode AE1, which is covered by the pixel definition pattern PDP, may be the same portion on each of the first light emitting elements LD1. According to an embodiment, the pixel definition pattern PDP may cover both edges of each of the first lower electrodes AE1 by the same area.

The pixel definition pattern PDP may have a ring shape when viewed in the thickness direction of the display panel 100, e.g., when viewed in the third direction DR3. However, embodiments of the present disclosure are not limited thereto. According to an embodiment, the pixel definition pattern PDP may have, for example, a lozenge shape or a rectangular shape when viewed in the third direction DR3.

The pixel definition layer PDL may be disposed in the second display area DP-A2 and the main display area DP-A3. The pixel definition layer PDL may cover a portion of each of the second lower electrode AE2 and the third lower electrode AE3. As an example, the pixel definition layer PDL may be provided with a first opening PDL-OP1 defined therethrough to expose a portion of the second lower electrode AE2 and a second opening PDL-OP2 defined therethrough to expose a portion of the third lower electrode AE3.

The pixel definition pattern PDP may increase a distance between an edge of the first lower electrode AE1 and the first upper electrode CE1, and the pixel definition layer PDL may increase a distance between an edge of each of the second lower electrode AE2 and an edge of the third lower electrode AE3 and the second and third upper electrodes CE2 and CE3. Accordingly, an occurrence of are on the edge of each of the first, second, and third lower electrodes AE1, AE2, and AE3 may be prevented by the pixel definition pattern PDP and the pixel definition layer PDL.

In the first area DP-A1, an area overlapping an area in which the first lower electrode AE1 and the pixel definition pattern PDP are disposed may be defined as an element area EA, and the other area may be defined as a transmission area TA.

The first lower electrode AE1 may be electrically connected to the first pixel circuit PC1 disposed in the second display area DP-A2. As an example, the first lower electrode AE1 may be electrically connected to the first pixel circuit PC1 via a connection electrode CNE1', the connection line TWL, and a connection bridge CPN. In this case, the connection line TWL may overlap the transmission area TA. Accordingly, the connection line TWL may include a light transmissive material.

The connection line TWL may be disposed between the fifth insulating layer 50 and the sixth insulating layer 60. However, embodiments of the present disclosure are not limited thereto. The connection bridge CPN may be disposed between the sixth insulating layer 60 and the seventh insulating layer 70. The connection bridge CPN may be connected to the connection line TWL and the first pixel circuit PC1. The connection electrode CNE1' may be connected to the first lower electrode AE1 and the connection line TWL.

The first light emitting layer EL1 may be disposed on the first lower electrode AE1, the second light emitting layer EL2 may be disposed on the second lower electrode AE2, and the third light emitting layer EL may be disposed on the third lower electrode AE3. In an embodiment, each of the first, second, and third light emitting layers EL1, EL2, and EL may emit a light having one of blue, red, and green colors.

The first upper electrode CE1, the second upper electrode CE2, and the third upper electrode CE3 may be disposed on the first, second, and third light emitting layers EL1, EL2, and EL3, respectively. The second upper electrode CE2 and the third upper electrode CE3 may be commonly disposed over the pixels PX (refer to FIG. 4). The second upper electrode CE2 may be commonly disposed over the second pixels PX2, and the third upper electrode CE3 may be commonly disposed over the third pixels PX3. The second upper electrode CE2 and the third upper electrode CE3 may be commonly disposed on each of the second pixels PX2 and the third pixels PX3 using an open mask.

A portion of the first upper electrode CE1 may be provided with a plurality of electrode openings CE1-OP. Each of the electrode openings CE1-OP may be defined in a portion overlapping the transmission area TA. As a portion of the first upper electrode CE1 is removed from the portion overlapping the transmission area TA, the light transmittance of the transmission area TA may be increased. According to an embodiment, the first upper electrode CE1 may be commonly formed on the first pixels PX1 using an open mask, and then, the portion of the first upper electrode CE1, which overlaps the transmission area TA, may be removed. Thus, the electrode openings CE1-OP may be defined.

Each of the first upper electrode CE1, the second upper electrode CE2, and the third upper electrode CE3 may be a light transmissive electrode. According to an embodiment, each of the first upper electrode CE1, the second upper electrode CE2, and the third upper electrode CE3 may be a transparent or semi-transparent electrode and may be formed of a metal thin film having a small work function and including, for example, Li, Ca, LiF/Ca, LiF/Al, Al, Ag, Mg, or a compound thereof. In addition, a transparent conductive oxide (TCO), such as, for example, indium tin oxide (ITO), indium zinc oxide (IZO), zinc oxide (ZnO), or indium oxide ($In_2O_3$), may be further disposed on the metal thin film.

According to an embodiment, a capping layer including an organic material may be disposed on the first, second, and third upper electrodes CE1, CE2, and CE3. The capping layer may protect the first, second, and third upper electrodes CE1, CE2, and CE3 and may increase a light extraction efficiency. The capping layer may include an organic material having a refractive index higher than that of the first, second, and third upper electrodes CE1, CE2, and CE3. According to an embodiment, the capping layer may be implemented by stacking layers having different refractive indices from each other. For example, the capping layer may be obtained by stacking a high refractive index layer/a low refractive index layer/a high refractive index layer. In this case, the high refractive index layer may have a refractive index equal to or greater than about 1.7, and the low refractive index layer may have a refractive index equal to or smaller than about 1.3. The capping layer may further include LiF. According to an embodiment, the capping layer may further include an inorganic insulating material, such as, for example, silicon oxide (SiO2), silicon nitride (SiNx), etc.

According to an embodiment, a hole control layer may be disposed between the first, second, and third pixel electrodes AE1, AE2, and AE3 and the first, second, and third light emitting layers EL1, EL2, and EL3. The hole control layer may include a hole transport layer and may further include a hole injection layer. An electron control layer may be disposed between the first, second, and third light emitting layers EL1, EL2, and EL and the first, second, and third upper electrodes CE1, CE2, and CE3. The electron control layer may include an electron transport layer and may further include an electron injection layer. The hole control layer and the electron control layer may be commonly formed over the plural pixels PX (refer to FIG. 4) using an open mask.

The encapsulation layer 140 may be disposed on the light emitting element layer 130. The encapsulation layer 140 may include an inorganic layer 141, an organic layer 142, and an inorganic layer 143, which are sequentially stacked. However, the layers included in the encapsulation layer 140 are not limited thereto.

The inorganic layers 141 and 143 may protect the light emitting element layer 130 from moisture and oxygen, and the organic layer 142 may protect the light emitting element layer 130 from a foreign substance such as dust particles. The inorganic layers 141 and 143 may include, for example, a silicon nitride layer, a silicon oxynitride layer, a silicon oxide layer, a titanium oxide layer, or an aluminum oxide layer. The organic layer 142 may include, for example, an acrylic-based organic layer. However, embodiments of the present disclosure are not limited thereto.

According to an embodiment, the first light blocking pattern LBL-1 may be disposed to overlap the first light emitting element LD1 in the first display area DP-A1. The first light blocking pattern LBL-1 may overlap the anode that is the first lower electrode AE1. The first light blocking patterns LBL-1 may be disposed under the anodes, respectively. The first light blocking patterns LBL-1 may be irregularly arranged when viewed in a plane. In the present disclosure, an "irregular arrangement" may mean that the first light blocking patterns LBL-1 are spaced apart from each other at different intervals. As an example, a center of one first light blocking pattern LBL-1 among the first light blocking patterns LBL-1 may be spaced apart from centers of the first light blocking patterns LBL-1 adjacent thereto at different intervals in the first direction DR1 or the second direction DR2.

The second light blocking patterns BML may be disposed to overlap the third pixel circuit PC3 and the third light emitting element LD3 in the third display area DP-A3. The second light blocking patterns BML may overlap the third lower electrode AE3. The second light blocking patterns BML may be regularly arranged when viewed in a plane. In the present disclosure, a "regular arrangement" may mean that the second light blocking patterns BML are spaced apart from each other at regular intervals from each other. As an example, a center of one second light blocking pattern BML among the second light blocking patterns BML may be spaced apart from centers of the second light blocking patterns BML adjacent thereto at regular intervals in the first direction DR1 or the second direction DR2. The first light blocking patterns LBL-1 and the second light blocking patterns BML will be described in detail with reference to FIGS. 9A to 10B below.

Figure 9A:
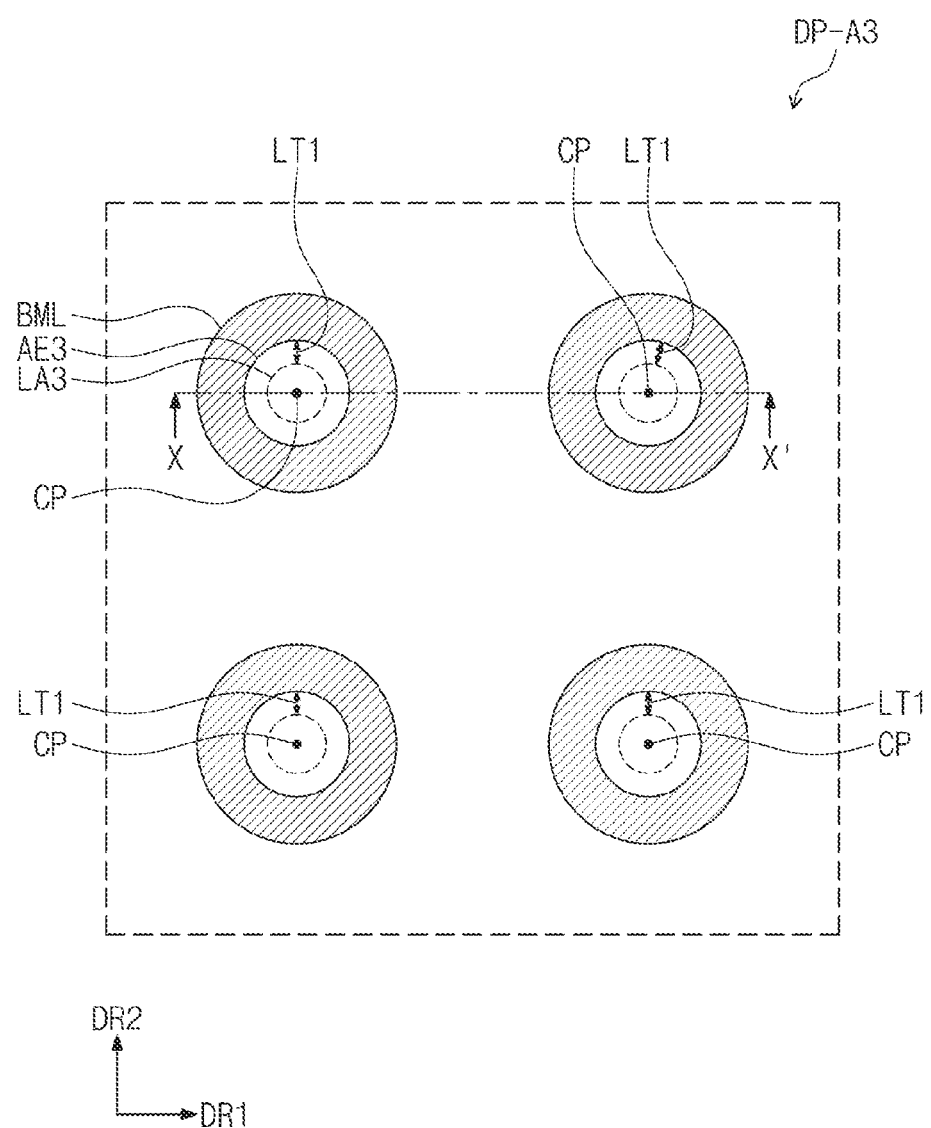
FIGS. 9A and 9B are views showing a main display area of the display panel of FIG. 7 according to an embodiment of the present disclosure.
Figure 9B:
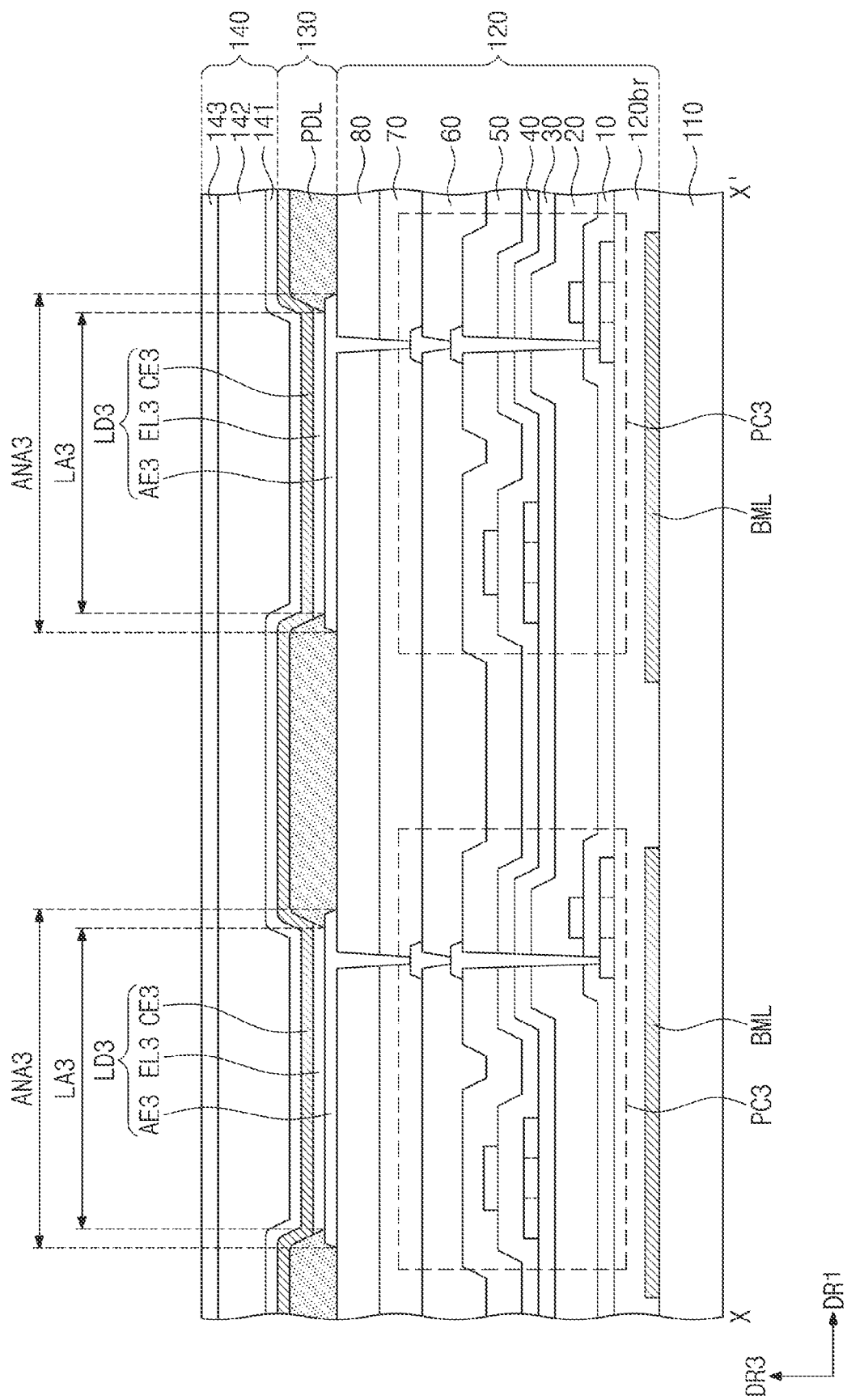
Figure 10A:
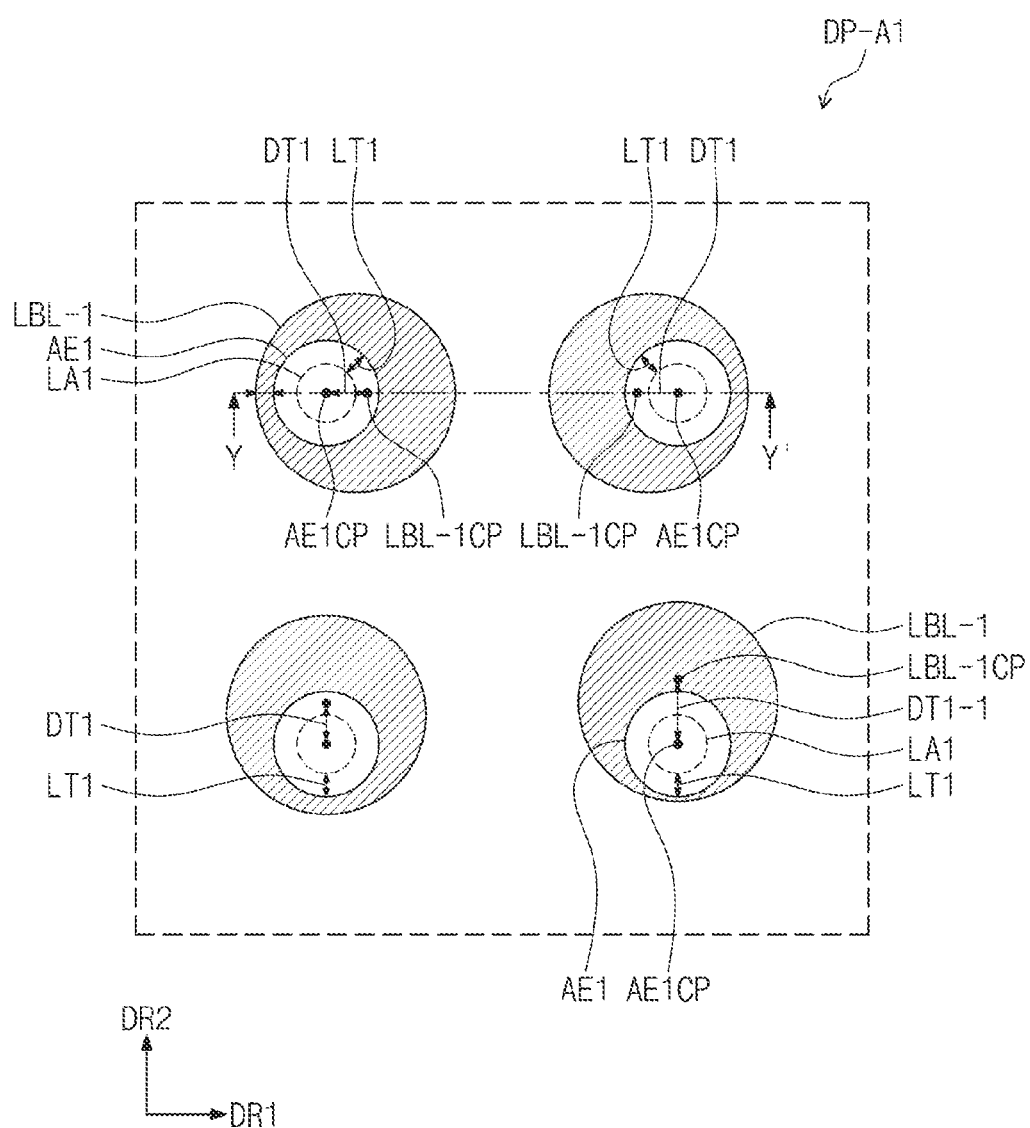
FIGS. 10A and 10B are views showing a first display area of the display panel of FIG. 8 according to an embodiment of the present disclosure.
Figure 10B:
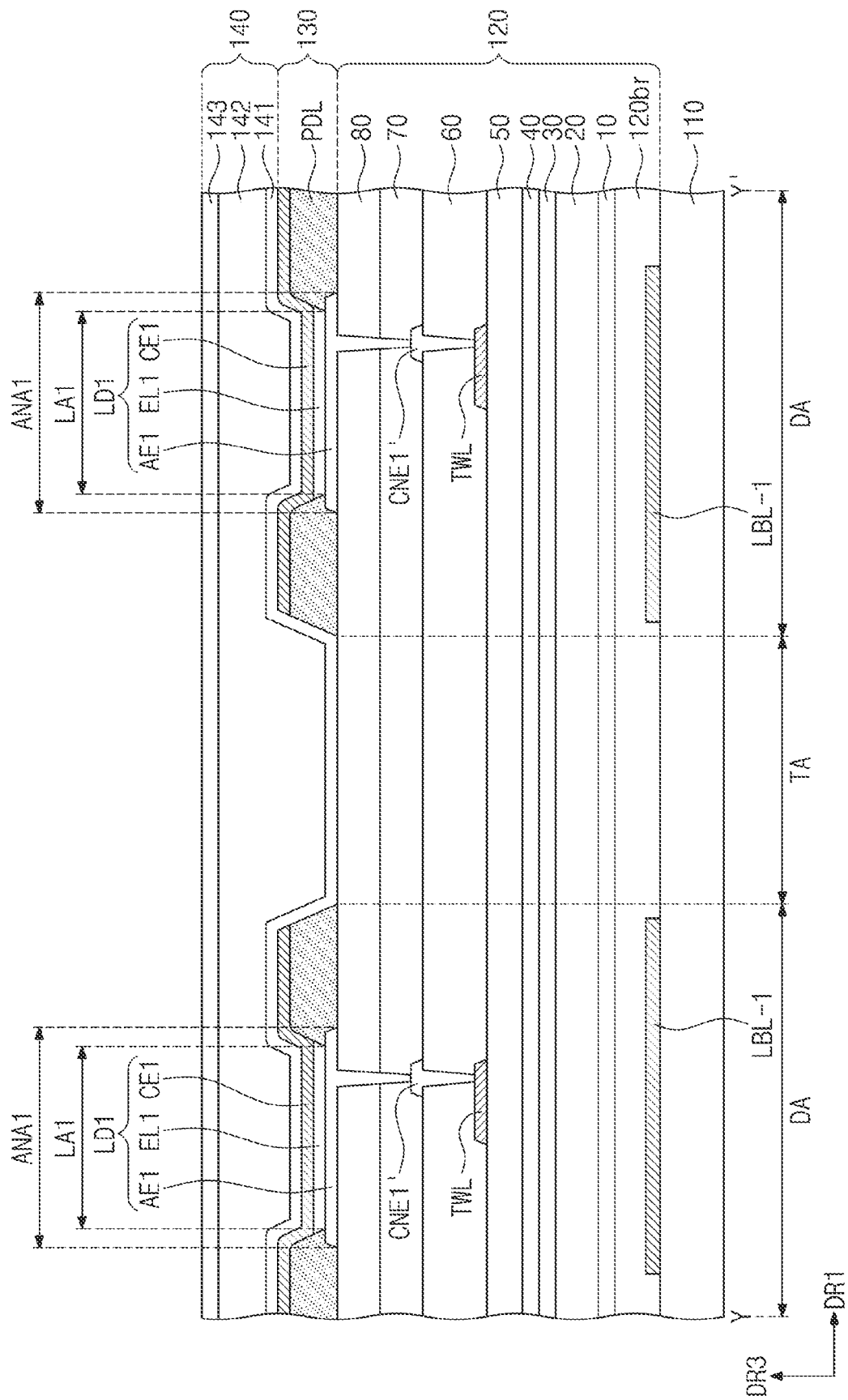

FIGS. 9A and 9B are views showing the main display area DP-A3 of the display panel of FIGS. 7 and 8 according to an embodiment of the present disclosure. FIGS. 10A and 10B are views showing the first display area DP-A1 of the display panel of FIG. 8 according to an embodiment of the present disclosure.

FIG. 9A is a plan view showing the main display area DP-A3, and FIG. 9B is a cross-sectional view showing the main display area DP-A3. FIG. 9A shows a portion of the main display area DP-A3 of the display panel, and FIG. 9B shows a cross-section taken along line X-X' of FIG. 9A.

Referring to FIGS. 9A and 9B, the third light emitting area LA3 may be defined on the third lower electrode AE3 in the main display area DP-A3. The third light emitting area LA3 may be defined at a certain position on the third lower electrode AE3. That is, each of the third light emitting areas LA3 may be defined at the same position in each of the third lower electrodes AE3. Accordingly, a shortest distance LT1 between an edge of each of the third light emitting areas LA3 and an edge of each of the third lower electrodes AE3 when viewed in a plane may be the same with respect to all of the third light emitting areas LA3 and the third lower electrodes AE3.

An area of each of the second light blocking patterns BML may be greater than an area of each of the third lower electrodes AE3 (hereinafter referred to as anodes) when viewed in a plane. That is, all of the anodes AE3 may be disposed inside the second light blocking patterns BML when viewed in the third direction DR3.

According to an embodiment, the second light blocking patterns BML may be aligned with the anodes AE3, respectively, in a plane. That is, a center CP of each of the second light blocking patterns BML may overlap a center CP of a corresponding anode among the anodes AE3. The second light blocking patterns BML may be disposed to be aligned with the anodes AE3 without being shifted in either direction with respect to the anodes AE3. That is, separation distances between the second light blocking patterns BML may be the same as each other.

FIG. 9A shows four anodes AE3 disposed in the main display area DP-A3 and adjacent to each other and the second light blocking patterns BML respectively corresponding to the four anodes AE3 as a representative example. All of the anodes AE3 and the second light blocking patterns BML corresponding to the anodes AE3, which are disposed in the main display area DP-A3, may be spaced apart from other anodes AE3 adjacent thereto and other corresponding second light blocking patterns BML at uniform intervals. In addition, the center CP of each of the anodes AE3 may overlap the center of the corresponding second light blocking pattern among the second light blocking patterns BML.

As shown in FIG. 9B, the third pixel circuits PC3 may be disposed under the third light emitting elements LD3, and the second light blocking patterns BML may be disposed under the third pixel circuits PC3. According to an embodiment, the second light blocking patterns BML may be spaced apart from each other at regular intervals.

FIG. 10A is a plan view showing the first display area DP-A1 according to an embodiment of the present disclosure, and FIG. 10B is a cross-sectional view showing the first display area according to an embodiment of the present disclosure. FIG. 10A shows a portion of the first display area DP-A1 of the display panel, and FIG. 10B shows a cross-section taken along line Y-Y' of FIG. 10A.

Referring to FIGS. 10A and 10B, the first light emitting area LA1 may be defined on the first lower electrode AE1 in the first display area DP-A1. The first light emitting area LA1 may be defined at a certain position on the first lower electrode AE1. That is, each of the first light emitting areas LA1 may be defined at the same position in each of the first lower electrodes AE1. Accordingly, a shortest distance LT1 between an edge of each of the first light emitting areas LA1 and an edge of each of the first lower electrodes AE1 when viewed in a plane may be the same with respect to all of the first light emitting areas LA1 and the first lower electrodes AE1.

According to an embodiment, the first lower electrodes AE1 (hereinafter referred to as anodes) are not aligned with the first light blocking patterns LBL-1 when viewed in a plane. According to an embodiment, the anodes AE1 may be regularly arranged at regular intervals from each other when viewed in a plane. However, the first light blocking patterns LBL-1 may be arranged irregularly at irregular intervals from each other when viewed in a plane. Each of the first light blocking patterns LBL-1 may have an area greater than an area of each of the anodes AE1 in a plane. Each of the anodes AE1 may be disposed inside of a corresponding first light blocking pattern among the first light blocking patterns LBL-1 when viewed in a plane.

According to an embodiment, a center LBL-1CP of each of the first light blocking patterns LBL-1 is not aligned with a center AE1CP of a corresponding anode of the anodes AE1. That is, the center LBL-1CP of the first light blocking patterns LBL-1 may be spaced apart from the center AE1CP of the anodes AE1 by a predetermined distance DT1. The structure in which the center LBL-1CP of the first light blocking patterns LBL-1 is spaced apart from the center AE1CP of the anodes AE1 by the predetermined distance DT1 may indicate that the first light blocking patterns LBL-1 are shifted from a corresponding anode among the anodes AE1 in one direction by the predetermined distance DT1 in a plane. That is, according to an embodiment, the first light blocking patterns LBL-1 and the anodes AE1 corresponding to the first light blocking patterns LBL-1 are not aligned with each other when viewed in a plane.

FIG. 10A shows four anodes AE1 adjacent to each other and four first light blocking patterns LBL-1 adjacent to each other and respectively corresponding to the anodes AE1. The relationship between the four anodes AE1 adjacent to each other and the four first light blocking patterns LBL-1 adjacent to each other of FIG. 10A may be applied to five or more anodes AE1 adjacent to each other and five or more first light blocking patterns LBL-1 adjacent to each other.

The four adjacent anodes AE1 in the first display area DP-A1 may be spaced apart from each other at regular intervals as the four adjacent anodes AE3 (refer to FIG. 9A) in the main display area DP-A3 (refer to FIG. 9A) are spaced apart from each other at regular intervals.

Referring to FIG. 10A, a first light blocking pattern LBL-1 may be shifted from the corresponding anode AE1 in the first direction DR1 by a first distance DT1, and a second first light blocking pattern LBL-1 may be shifted from the corresponding anode AE1 in a direction opposite to the first direction DR1 by the first distance DT1. The first light blocking pattern LBL-1 and the second first light blocking pattern LBL-1 may have the same shift distance but different shift directions.

A third first light blocking pattern LBL-1 may be shifted from the corresponding anode AE1 in the second direction DR2 by the first distance DT1. A fourth first light blocking pattern LBL-1 may be shifted from the corresponding anode AE1 in the second direction DR2 by a second distance DT1-1. That is, the third first light blocking pattern LBL-1 and the fourth first light blocking pattern LBL-1 may have the same shift direction but different shift distances.

In an embodiment, the first light blocking patterns LBL-A1 disposed in the first display area DP-A1 may be shifted from the corresponding anodes AE1 in different directions from each other or by different distances from each other. According to an embodiment, the first light blocking patterns LBL-A1 adjacent to each other may have different shift directions and different shift distances. The four first light blocking patterns LBL-1 shown in FIG. 10A may have substantially the same area and the same shape in a plane. The area and the shape of the first light blocking patterns LBL-1 will be described below with reference to FIGS. 15 to 17.

Referring to FIG. 10B, the transmission area TA may be defined between the first light blocking patterns LBL-1 adjacent to each other in the first display area DP-A1. Neither the anodes AE1 nor the first light blocking patterns LBL-1 are disposed in the transmission area TA.

Figure 11:
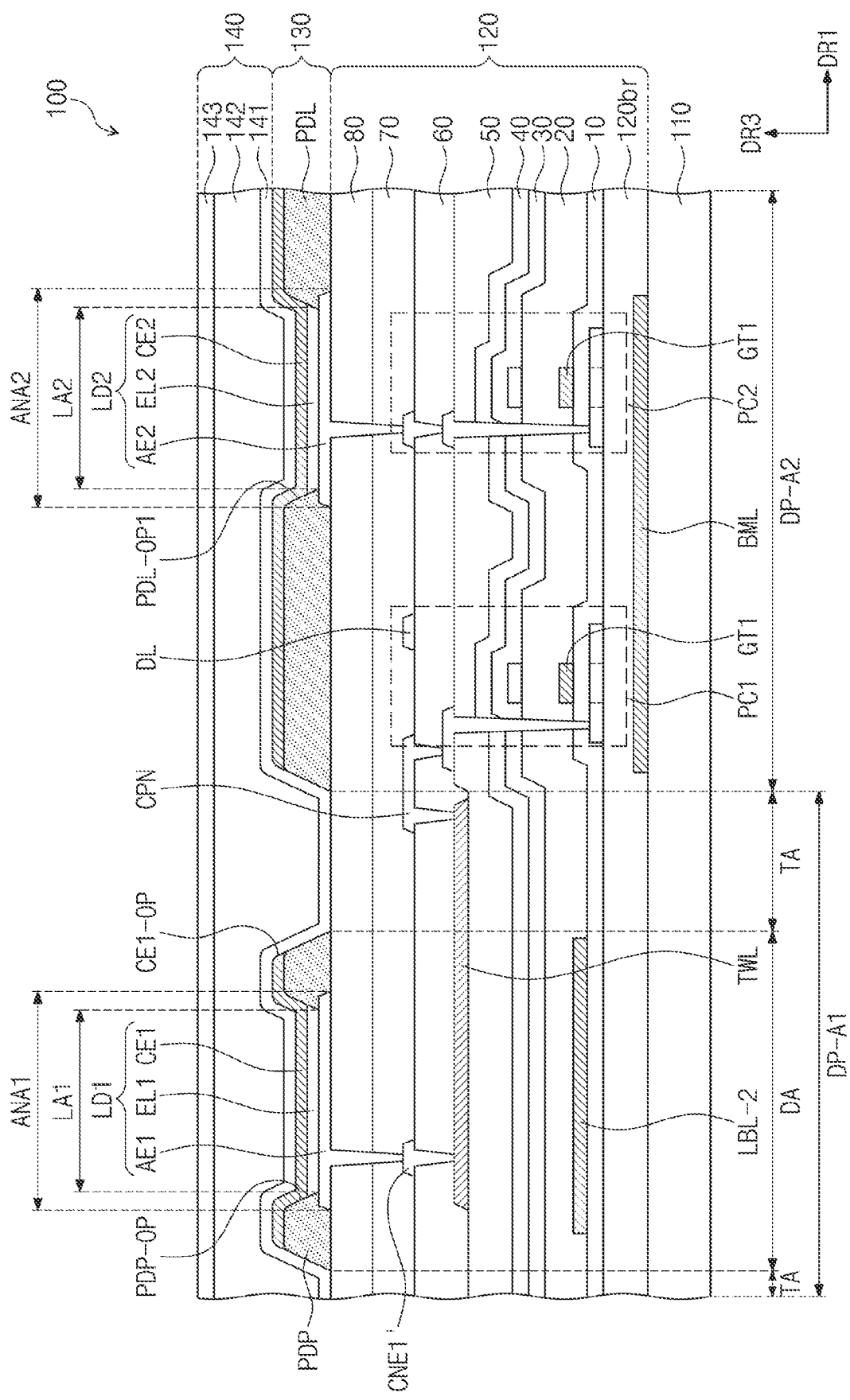
FIG. 11 is a cross-sectional view showing a display panel according to an embodiment of the present disclosure.
Figure 12A:
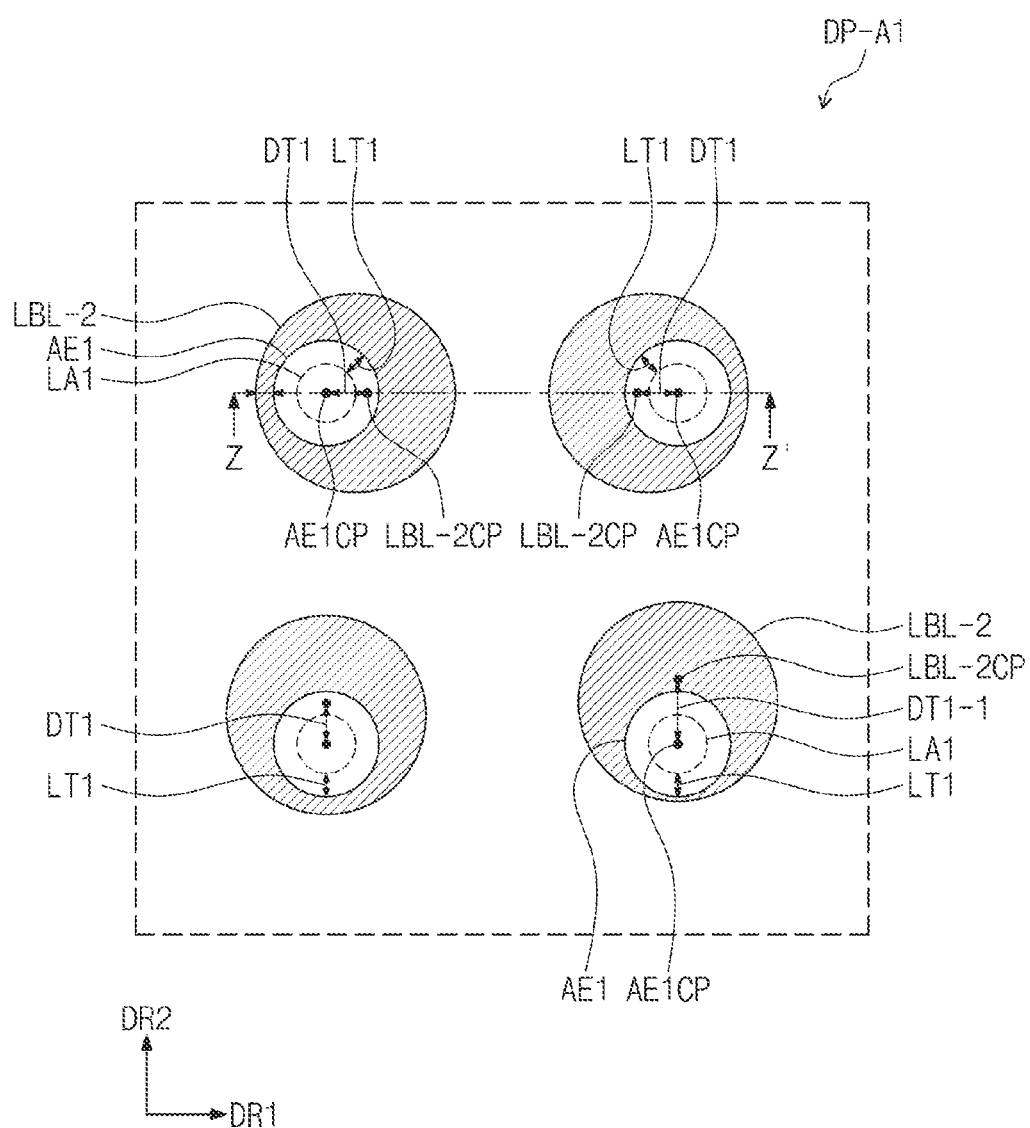
FIGS. 12A and 12B are views showing a first display area of the display panel of FIG. 11 according to an embodiment of the present disclosure.
Figure 12B:
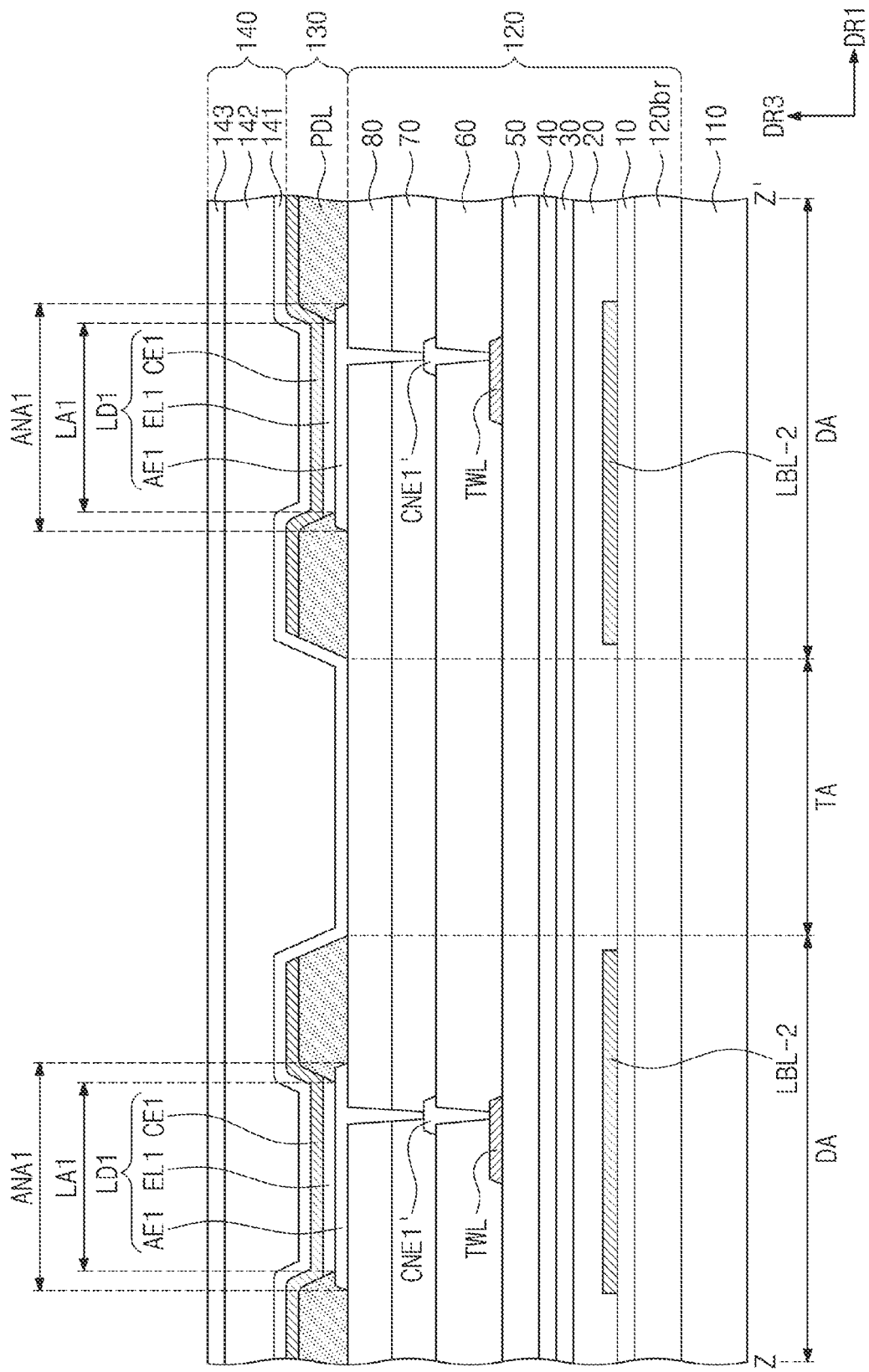

FIG. 11 is a cross-sectional view showing a display panel 100 according to an embodiment of the present disclosure. FIGS. 12A and 12B are views showing a first display area of the display panel of FIG. 11 according to an embodiment of the present disclosure.

Referring to FIG. 11, a first light blocking pattern LBL-2 may be disposed on a first insulating layer 10 of a circuit layer 120 in the first display area DP-A1. In an embodiment, a second light blocking pattern BML may be omitted.

The first light blocking pattern LBL-2 may be disposed on the same layer as first gates GT1 in the main display area DP-A3 (refer to FIG. 7) and a second display area DP-A2. The first light blocking pattern LBL-2 may include the same metal or material as that of the first gates GT1. The first light blocking pattern LBL-2 may include, for example, titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), indium zinc oxide (IZO), etc. That is, the first light blocking pattern LBL-2 may be formed through the same process as the first gates GT1.

FIG. 12A is a plan view showing a portion of the first display area DP-A1 of the display panel according to an embodiment of the present disclosure, and FIG. 12B is a cross-sectional view taken along line Z-Z' of FIG. 12A according to an embodiment of the present disclosure.

Referring to FIGS. 12A and 12B, the first light blocking pattern LBL-2 overlapping a first lower electrode AE1 (hereinafter referred to as an anode) may be disposed on a first insulating layer 10, which may be the same layer that the first gates GT1 are disposed on. Referring to FIGS. 12A and 12B, a further description of similar aspects as those previously described with reference to FIGS. 10A and 10B is omitted.

Figure 13:
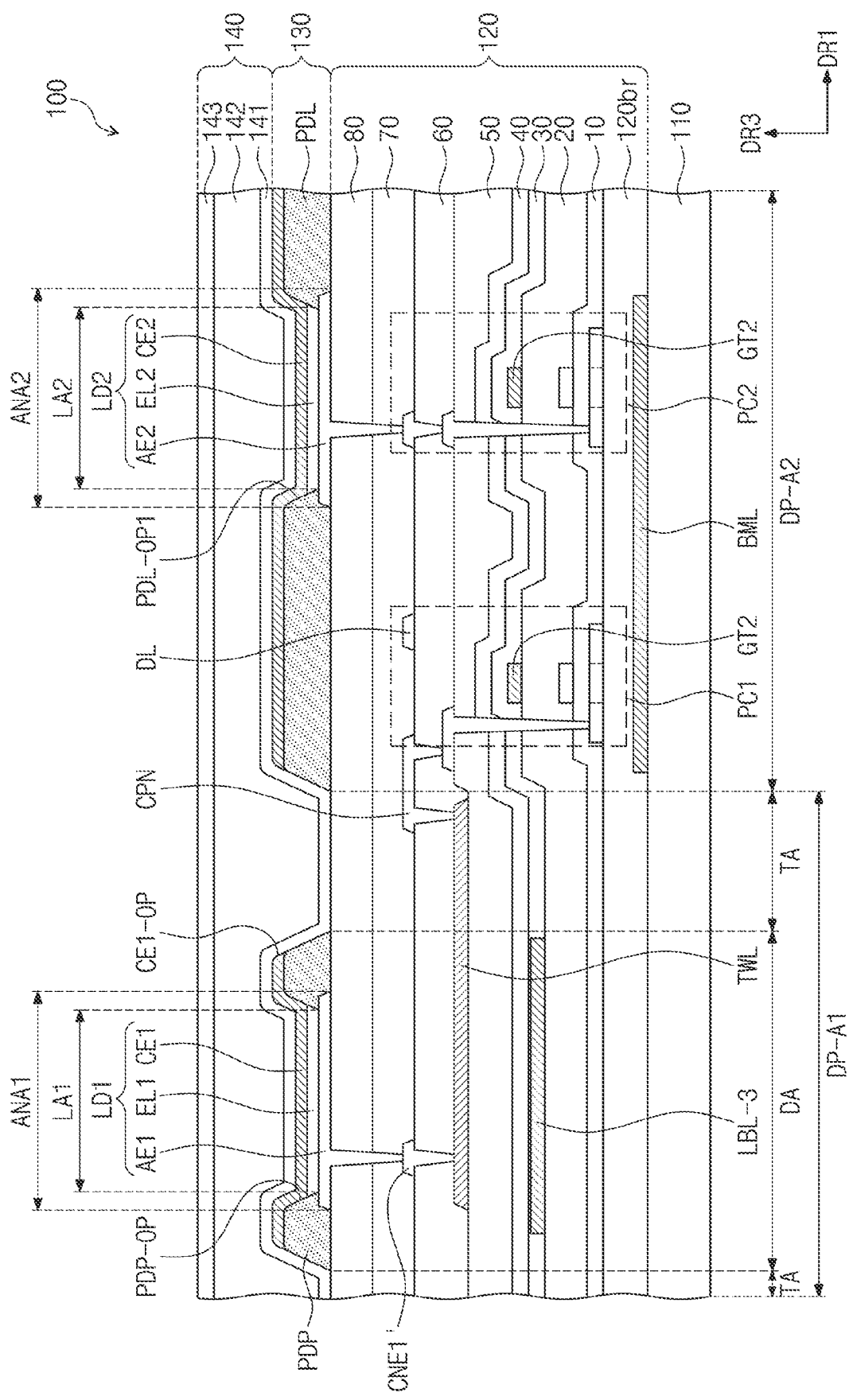
FIG. 13 is a cross-sectional view showing a display panel according to an embodiment of the present disclosure.
Figure 14A:
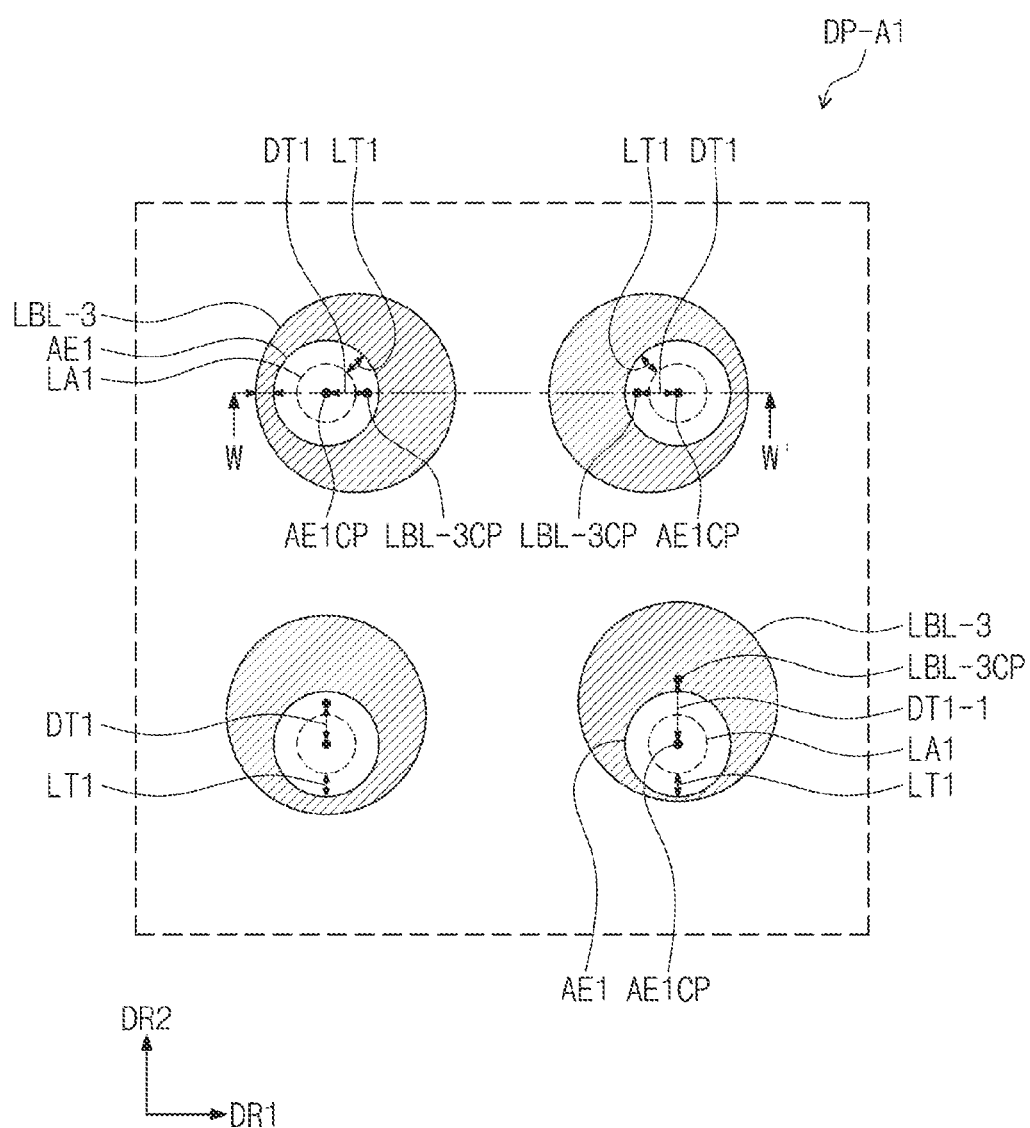
FIGS. 14A and 14B are views showing a first display area of the display panel of FIG. 13 according to an embodiment of the present disclosure.
Figure 14B:
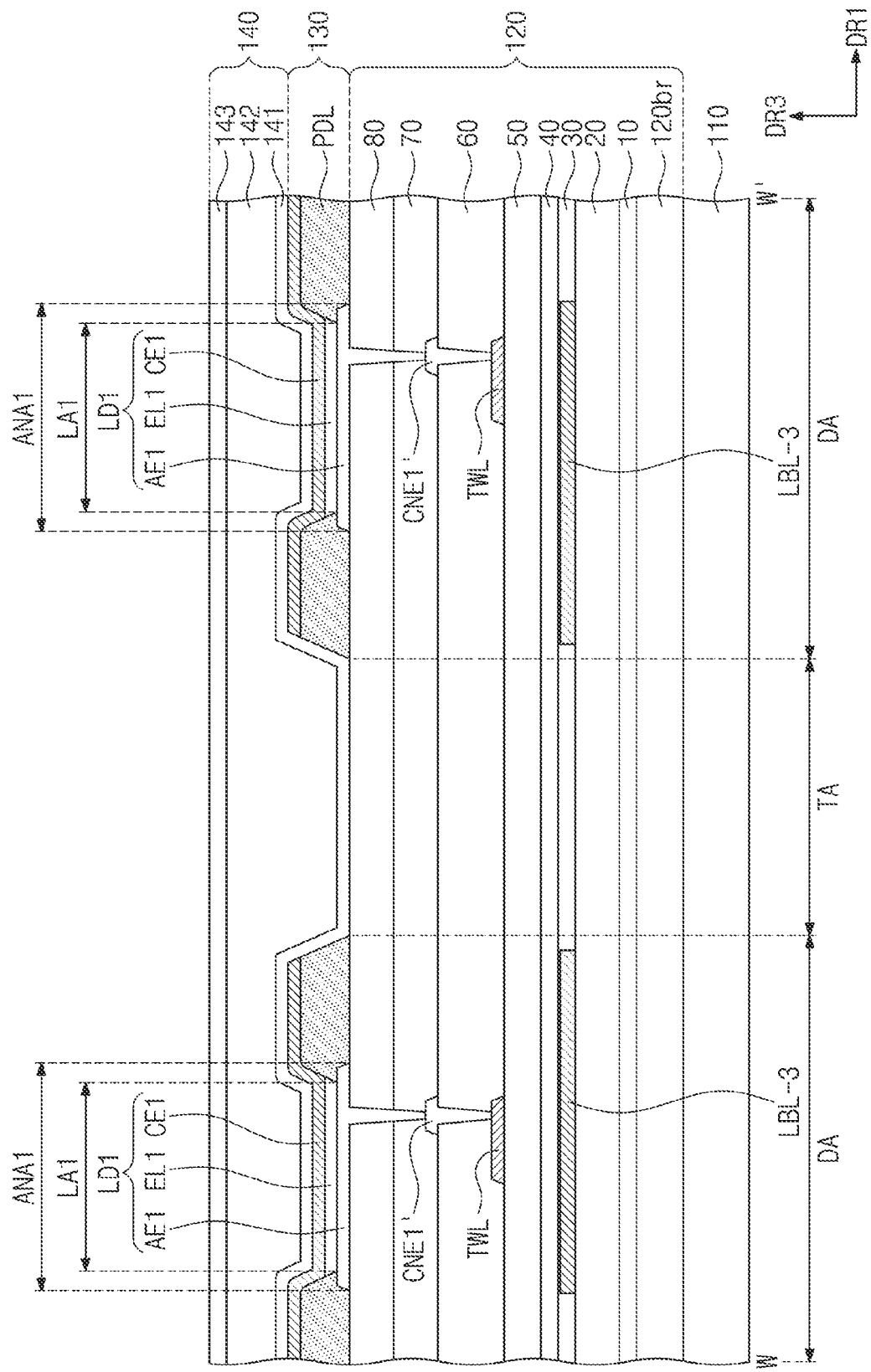

FIG. 13 is a cross-sectional view showing a display panel 100 according to an embodiment of the present disclosure. FIGS. 14A and 14B are views showing a first display area DP-A1 of the display panel 100 of FIG. 13.

Referring to FIG. 13, a first light blocking pattern LBL-3 may be disposed on a second insulating layer 20 of a circuit layer 120 in the first display area DP-A1. In an embodiment, a second light blocking pattern BML may be omitted.

The first light blocking pattern LBL-3 may be disposed on the same layer as second gates GT2 in the main display area DP-A3 (refer to FIG. 7) and a second display area DP-A2. FIG. 13 shows a structure in which the first light blocking pattern LBL-3 and the second gates GT2 are disposed on the same second insulating layer 20. According to an embodiment, the first light blocking pattern LBL-3 may be disposed on a fourth insulating layer 40 that is the same layer as a layer on which the second gates GT2 are disposed in the main display area DP-A3.

The first light blocking pattern LBL-3 may include the same metal or material as that of the second gates GT2. The first light blocking pattern LBL-3 may include, for example, titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), indium zinc oxide (IZO), etc. That is, the first light blocking pattern LBL-3 may be formed through the same processes as the second gates GT2.

FIG. 14A is a plan view showing a portion of a first display area DP-A1 of a display panel according to an embodiment of the present disclosure, and FIG. 14B is a cross-sectional view taken along line W-W' of FIG. 14A according to an embodiment of the present disclosure.

Referring to FIGS. 14A and 14B, a first light blocking pattern LBL-3 overlapping a first lower electrode AE1 (hereinafter referred to as an anode) may be disposed on a second insulating layer 20 or a fourth insulating layer 40, which is the same layer on which the second gates GT2 are disposed. Referring to FIGS. 14A and 14B, a further description of similar aspects as those previously described with reference to FIGS. 10A and 10B is omitted.

Figure 15:
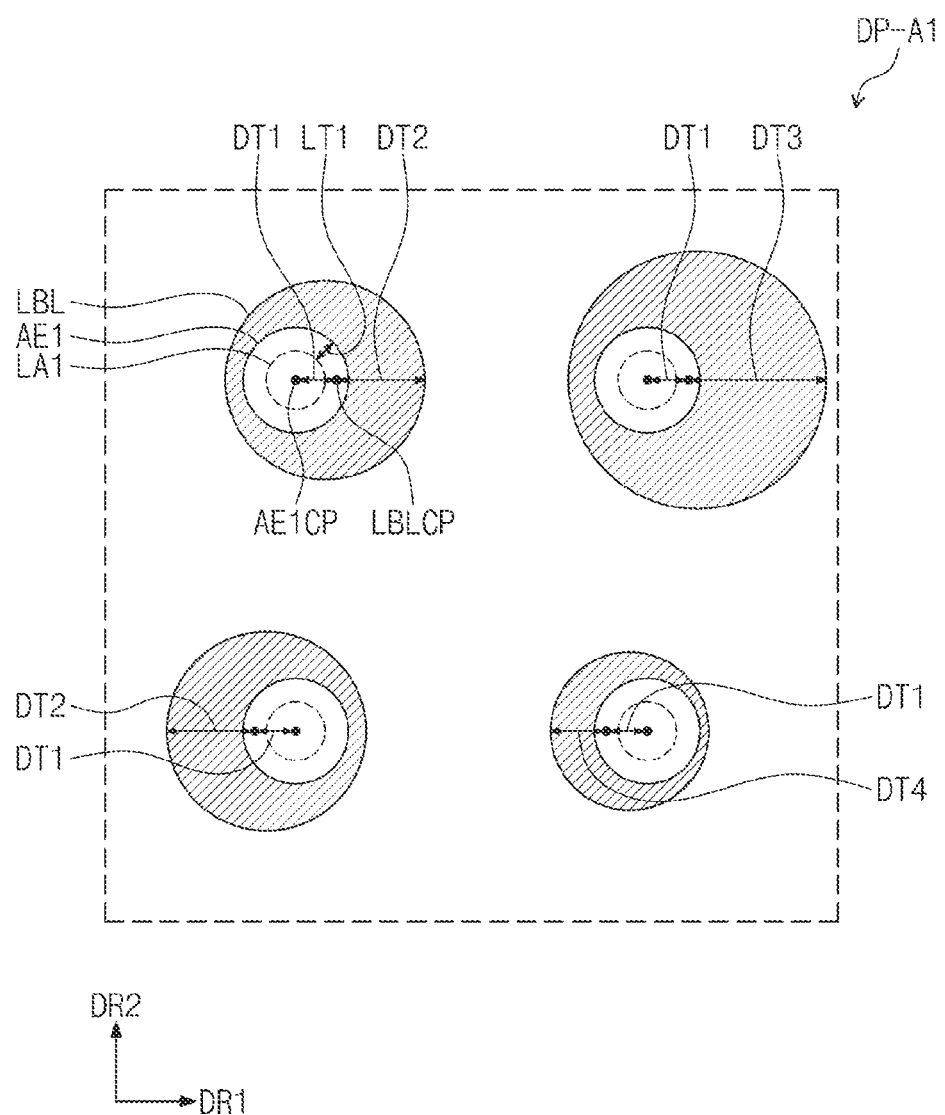
FIGS. 15 to 17 are views showing a first display area of a display panel according to an embodiment of the present disclosure.
Figure 16:
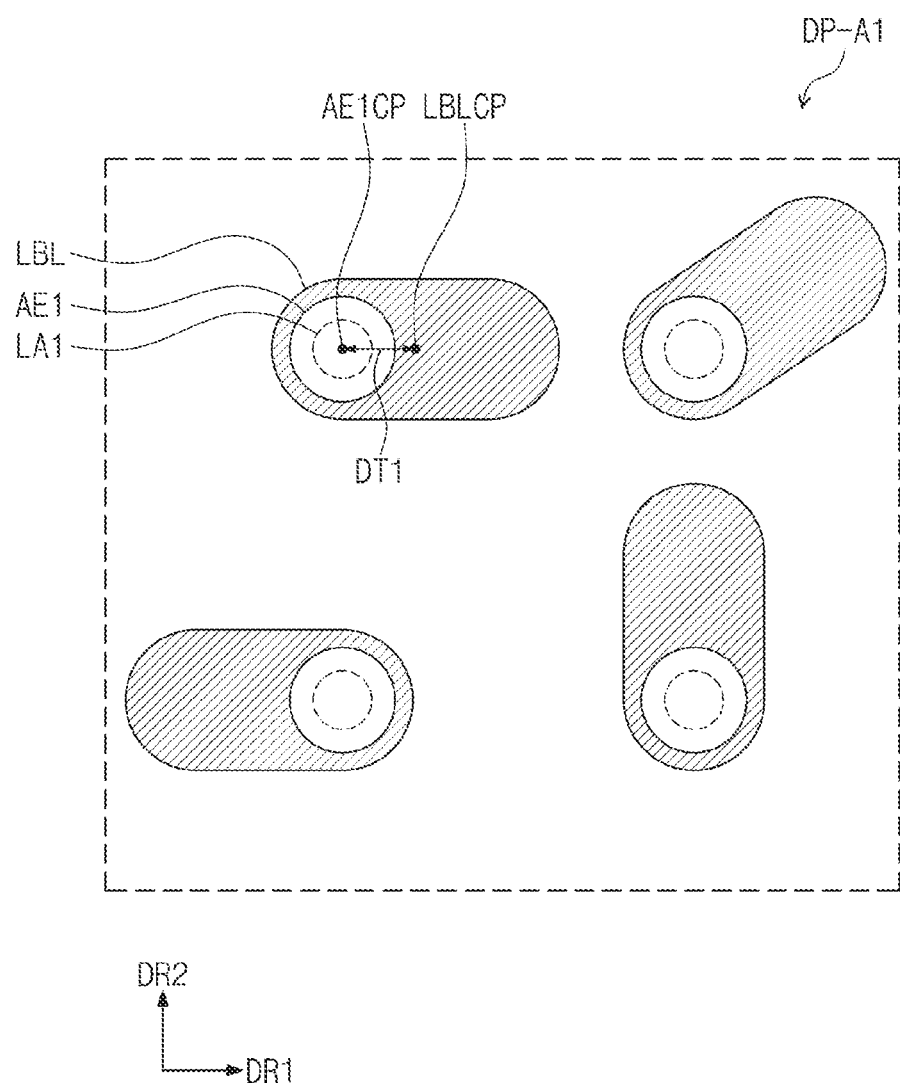
Figure 17:
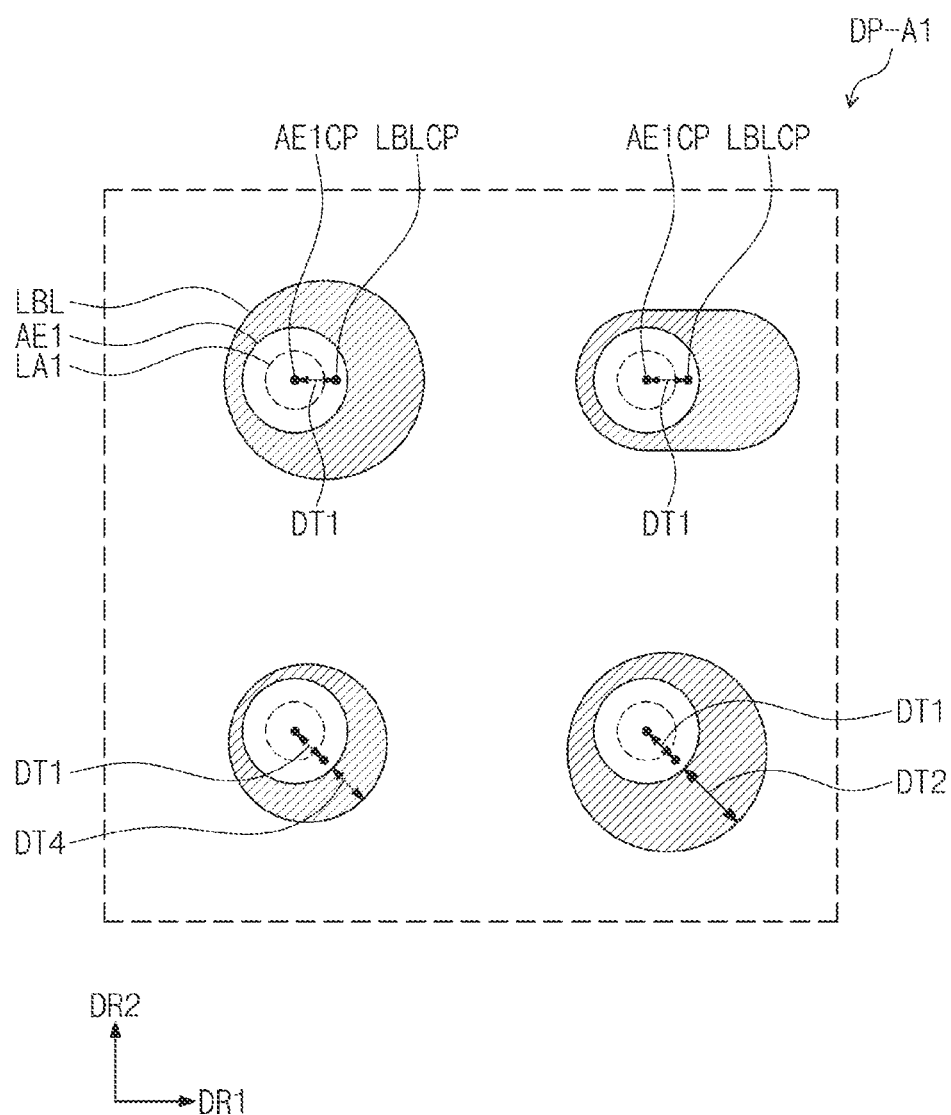

FIGS. 15 to 17 are views showing a first display area of a display panel according to an embodiment of the present disclosure.

FIG. 15 shows a plurality of first light blocking patterns LBL having different areas. FIG. 16 shows a plurality of first light blocking patterns LBL with shapes other than a circular shape. FIG. 17 shows a plurality of first light blocking patterns LBL having different sizes and different shapes.

Referring to FIGS. 15 to 17, the first light blocking patterns LBL may include the first light blocking patterns LBL-1 of FIG. 8, the first light blocking patterns LBL-2 of FIG. 11, and the first light blocking patterns LBL-3 of FIG. 13 according to various embodiments of the present disclosure. That is, the first light blocking patterns LBL may be disposed on a base layer 110, a first insulating layer 10, a second insulating layer 20, or a fourth insulating layer 40.

Referring to FIG. 15, the first light blocking patterns LBL shifted in the same direction by the same shift distance from corresponding first lower electrodes AE1 (hereinafter referred to as anodes) in a plane may have different areas from each other.

As an example, a first light blocking pattern LBL and a second first light blocking pattern LBL, which are adjacent to each other in the first direction DR1, may be shifted in the first direction DR1 by the same shift distance, e.g., a first distance DT1. However, the first light blocking pattern LBL may have the area smaller than that of the second first light blocking pattern LBL according to an embodiment.

That is, the second first light blocking pattern LBL may have a radius DT3 greater than a radius DT2 of the first light blocking pattern LBL.

A third first light blocking pattern LBL and a fourth first light blocking pattern LBL, which are adjacent to each other in the first direction DR1, may have different areas from each other. The third first light blocking pattern LBL may have a radius DT2 greater than a radius DT4 of the fourth first light blocking pattern LBL.

In addition, the first light blocking pattern LBL and the third first light blocking pattern LBL, which are adjacent to each other in the second direction DR2, may have the same areas as each other, but may be shifted in opposite directions to each other. The second first light blocking pattern LBL and the fourth first light blocking pattern LBL may be shifted in opposite directions to each other and may have different areas.

The first light blocking pattern LBL and the fourth first light blocking pattern LBL may be shifted by the same distance, e.g., the first distance DT1, but may be shifted in opposite directions to each other and may have different areas from each other. The second first light blocking pattern LBL and the third first light blocking pattern LBL may be shifted by the same distance, e.g., the first distance DT1, but may be shifted in opposite directions to each other and may have different areas from each other.

That is, according to an embodiment, the first light blocking patterns LBL may have different areas in the first display area DP-A1, or when the first light blocking patterns LBL have the same area, the first light blocking patterns LBL may be shifted in different directions with respect to a corresponding anode AE1 or may be shifted by different distances.

Referring to FIG. 16, first light blocking patterns LBL may have an oval-like shape or an oval shape elongated in the first direction DR1, the second direction DR2, or a diagonal direction with respect to the first direction and the second direction. That is, the shape of the first light blocking patterns LBL is not limited to a circular shape and may have various different shapes. Similar to the first light blocking patterns LBL described with reference to FIG. 15, as shown in FIG. 16, the first light blocking patterns LBL adjacent to each other may have the same shape, however, may be shifted in different directions with respect to a corresponding anode AE1 and/or may be shifted by distances different from each other.

FIG. 17 shows first lower electrodes AE1 and first light blocking patterns LBL overlapping the first lower electrodes AE1, which are included in four first light emitting elements LD1 (refer to FIG. 8) adjacent to each other in a first display area DP-A1.

Referring to FIG. 17, a first light blocking pattern LBL and a second first light blocking pattern LBL may be shifted in the first direction DR1 and may be shifted by the same shift distance, e.g., a first distance DT1. In a case in which the first light blocking pattern LBL and the second first light blocking pattern LBL have substantially the same area when viewed in a plane, the first light blocking pattern LBL and the second first light blocking pattern LBL may have different shapes. That is, the first light blocking pattern LBL may have a circular shape, and the second first light blocking pattern LBL may have an oval shape elongated in the first direction DR.

According to an embodiment, the first light blocking pattern LBL may be shifted in a diagonal direction between the first direction DR1 and the second direction DR2. A third first light blocking pattern LBL and a fourth first light blocking pattern LBL may be shifted in the diagonal direction by the same shift distance. The third first light blocking pattern LBL and the fourth first light blocking pattern LBL may have different sizes from each other. In FIG. 17, the four first light blocking patterns LBL adjacent to each other may differ in at least one of the shift direction, the shift distance, the size, and the shape.

According to embodiments of the present disclosure, the sensitivity of the electronic module may be increased while maintaining a high display quality in the area where the electronic module is disposed.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A display device, comprising:
an electronic module; and
a display panel, comprising:
a first display area that overlaps the electronic module;
a second display area that does not overlap the electronic module;
a base layer;
a light emitting element layer disposed on the base layer; and
a light blocking layer disposed between the base layer and the light emitting element layer,
wherein the light emitting element layer comprises:
a plurality of first light emitting elements disposed in the first display area; and
a plurality of second light emitting elements disposed in the second display area,
wherein the light blocking layer comprises:
a plurality of first light blocking patterns disposed in the first display area and respectively overlapping the first light emitting elements; and
a plurality of second light blocking patterns disposed in the second display area and respectively overlapping the second light emitting elements.

2. The display device of claim 1,
wherein the first light blocking patterns are irregularly arranged when viewed in a plane, and the second light blocking patterns are regularly arranged when viewed in the plane.

3. The display device of claim 2, wherein each of the first light blocking patterns is not aligned with the corresponding overlapped first light emitting element among the first light emitting elements when viewed in the plane, and each of the second light blocking patterns is aligned with the corresponding overlapped second light emitting element among the second light emitting elements when viewed in the plane.

4. The display device of claim 1, wherein a center of one first light blocking pattern among the first light blocking patterns is shifted from a center of the corresponding overlapped first light emitting element by a first distance in a first direction, and a center of another first light blocking pattern adjacent to the one first light blocking pattern is shifted from a center of the corresponding overlapped first light emitting element by a second distance in a second direction.

5. The display device of claim 4, wherein the first distance is different from the second distance when the first direction is the same as the second direction, and the first distance is the same as or different from the second distance when the first direction is different from the second direction.

6. The display device of claim 4, wherein the one first light blocking pattern has an area different from an area of the another first light blocking pattern in a plane when the first direction is the same as the second direction and the first distance is the same as the second distance.

7. The display device of claim 4, wherein the one first light blocking pattern has a shape different from a shape of the another first light blocking pattern in a plane when the first direction is the same as the second direction and the first distance is the same as the second distance.

8. The display device of claim 1, wherein the display panel further comprises:
a circuit layer disposed between the base layer and the light emitting element layer in the second display area, and comprising a pixel circuit that drives the second light emitting elements,
wherein the circuit layer comprises:
a plurality of insulating layers comprising a first insulating layer and a second insulating layer disposed on the first insulating layer,
wherein the pixel circuit comprises:
a first gate disposed on the first insulating layer in the second display area and a second gate disposed on the second insulating layer in the second display area.

9. The display device of claim 8, wherein the first light blocking patterns and the first gate are disposed on a same layer and comprise a same material.

10. The display device of claim 8, wherein the first light blocking patterns and the second gate are disposed on a same layer and comprise a same material.

11. The display device of claim 1, wherein the display panel further comprises:
a third display area adjacent to the first display area;
a plurality of third light emitting elements disposed in the third display area;
a first pixel circuit disposed in the third display area that drives one of the first light emitting elements; and
a third pixel circuit disposed in the third display area that drives one of the third light emitting elements.

12. The display device of claim 11, wherein the display panel further comprises:
a second pixel circuit disposed in the second display area that drives one of the second light emitting elements,
wherein the first display area has a greater transmittance than a transmittance of the second display area and a transmittance of the third display area.

13. The display device of claim 2, wherein each of the first light emitting elements comprises:
a first lower electrode in which a light emitting area is defined;
a first light emitting layer disposed on the first lower electrode; and
a first upper electrode disposed on the first light emitting layer,
wherein each of the first light blocking patterns overlaps the first lower electrode, and each of the first light blocking patterns has an area greater than an area of the first lower electrode.

14. The display device of claim 13, wherein the light emitting area is defined in each of the first lower electrodes of the first light emitting elements, and each of the light emitting areas is defined at a same position in each of the first lower electrodes in a plane.

15. The display device of claim 2, wherein the light blocking layer is disposed on the base layer, and the display panel further comprises:
a circuit layer disposed between the light blocking layer and the light emitting element layer,
wherein the second light blocking patterns are implemented as a rear surface metal layer.

16. A display device, comprising:
an electronic module; and
a display panel, comprising:
a first display area that overlaps the electronic module;
a second display area that does not overlap the electronic module and has a transmittance greater than a transmittance of the first display area;
a base layer; and
a light emitting element layer disposed on the base layer,
wherein the light emitting element layer comprises:
a plurality of first light emitting elements disposed in the first display area, each of the first light emitting elements comprising a first lower electrode, a first light emitting layer, and a first upper electrode; and
a plurality of second light emitting elements disposed in the second display area, each of the second light emitting elements comprising a second lower electrode, a second light emitting layer, and a second upper electrode,
wherein the display panel further comprises:
a plurality of first light blocking patterns disposed in the first display area and respectively overlapping the corresponding first lower electrodes; and
a plurality of second light blocking patterns disposed in the second display area and respectively overlapping the corresponding second lower electrodes,
wherein each of the first light blocking patterns is not aligned with the corresponding first lower electrode, and each of the second light blocking patterns is aligned with the corresponding second lower electrode.

17. The display device of claim 16, wherein the display panel further comprises:
a circuit layer disposed between the base layer and the light emitting element layer,
wherein the circuit layer comprises a plurality of insulating layers, the first light blocking patterns and the second light blocking patterns are disposed on a same layer, and the first light blocking patterns and the second light blocking patterns are disposed on the base layer or one of the insulating layers.

18. The display device of claim 16, wherein the first lower electrode comprises a light emitting area defined therein by a pixel definition pattern that covers a portion of the first lower electrode, and a position of the light emitting area defined in the first lower electrode is the same in each of the first light emitting elements.

19. The display device of claim 16, wherein one first light blocking pattern among the first light blocking patterns is shifted from the corresponding overlapped first lower electrode in a first direction by a first distance in a plane, and another first light blocking pattern among the first light blocking patterns is shifted from the corresponding overlapped first lower electrode in a second direction by a second distance.

20. The display device of claim 19, wherein the first direction is different from the second direction, and the first distance is the same as or different from the second distance.

21. The display device of claim 16, wherein the first light blocking patterns and the second light blocking patterns comprise a same metal.

22. The display device of claim 16, wherein the display panel further comprises:
a third display area adjacent to the first display area;
a plurality of third light emitting elements disposed in the third display area;
a first pixel circuit disposed in the third display area that drives one of the first light emitting elements; and
a third pixel circuit disposed in the third display area that drives one of the third light emitting elements.

23. The display device of claim 22, wherein the display panel further comprises:
a circuit layer disposed between the base layer and the light emitting element layer in the third display area, and comprising the first pixel circuit and the third pixel circuit,
wherein the circuit layer comprises:
a plurality of insulating layers comprising a first insulating layer and a second insulating layer disposed on the first insulating layer,
wherein each of the first pixel circuit and the third pixel circuit comprises a first gate disposed on the first insulating layer and a second gate disposed on the second insulating layer.

24. An electronic device, comprising:
an electronic module; and
a display panel, comprising:
a first display area that overlaps the electronic module;
a second display area that does not overlap the electronic module and has a transmittance greater than a transmittance of the first display area;
a base layer; and a light emitting element layer disposed on the base layer, wherein the light emitting element layer comprises:

a plurality of first light emitting elements disposed in the first display area, each of the first light emitting elements comprising a first lower electrode, a first light emitting layer, and a first upper electrode; and a plurality of second light emitting elements disposed in the second display area, each of the second light emitting elements comprising a second lower electrode, a second light emitting layer, and a second upper electrode, wherein the display panel further comprises:

a plurality of first light blocking patterns disposed in the first display area and respectively overlapping the corresponding first lower electrodes; and a plurality of second light blocking patterns disposed in the second display area and respectively overlapping the corresponding second lower electrodes, wherein each of the first light blocking patterns is not aligned with the corresponding first lower electrode, and each of the second light blocking patterns is aligned with the corresponding second lower electrode.

* * * * *